United States Patent
Madurawe

(10) Patent No.: US 7,265,421 B2
(45) Date of Patent: Sep. 4, 2007

(54) INSULATED-GATE FIELD-EFFECT THIN FILM TRANSISTORS

(75) Inventor: Raminda Udaya Madurawe, Sunnyvale, CA (US)

(73) Assignee: Viciciv Technology, Sunnyvale, CA (US)

( * ) Notice: Subject to any disclaimer, the term of this patent is extended or adjusted under 35 U.S.C. 154(b) by 0 days.

(21) Appl. No.: 10/979,024

(22) Filed: Nov. 2, 2004

(65) Prior Publication Data

US 2005/0121721 A1 Jun. 9, 2005

Related U.S. Application Data

(62) Division of application No. 10/762,627, filed on Jan. 23, 2004, now Pat. No. 7,018,875, which is a division of application No. 10/413,808, filed on Apr. 14, 2003, now abandoned.

(60) Provisional application No. 60/449,011, filed on Feb. 24, 2003, provisional application No. 60/402,573, filed on Aug. 12, 2002, provisional application No. 60/400,007, filed on Aug. 1, 2002, provisional application No. 60/397,070, filed on Jul. 22, 2002, provisional application No. 60/393,763, filed on Jul. 8, 2002.

(51) Int. Cl.
*H01L 31/0392* (2006.01)

(52) U.S. Cl. .................. 257/348; 257/402; 257/E21.631

(58) Field of Classification Search .............. 257/347, 257/348, 350, 351, 407, 402, 353, 403, 404, 257/412, 66, 57; 438/300
See application file for complete search history.

(56) References Cited

U.S. PATENT DOCUMENTS

| | | | |
|---|---|---|---|
| 4,065,781 A | 12/1977 | Gutknecht | |
| 4,502,204 A | 3/1985 | Togashi et al. | |
| 4,672,645 A | 6/1987 | Bluzer et al. | |
| 5,151,759 A * | 9/1992 | Vinal | 257/348 |
| 5,164,805 A * | 11/1992 | Lee | 257/351 |
| 5,266,515 A | 11/1993 | Robb et al. | |
| 5,340,999 A | 8/1994 | Takeda et al. | |
| 5,471,070 A * | 11/1995 | Shimada et al. | 257/57 |
| 5,537,078 A | 7/1996 | Strong | |
| 5,550,397 A * | 8/1996 | Lifshitz et al. | 257/412 |
| 5,572,040 A * | 11/1996 | Reedy et al. | 257/9 |
| 5,656,844 A | 8/1997 | Klein et al. | |
| 5,981,317 A | 11/1999 | French et al. | |
| 6,031,249 A * | 2/2000 | Yamazaki et al. | 257/66 |
| 6,107,642 A | 8/2000 | Sundaresan | |
| 6,222,234 B1 | 4/2001 | Imai | |
| 6,271,063 B1 | 8/2001 | Chan et al. | |
| 6,339,244 B1 | 1/2002 | Krivokapic | |

(Continued)

*Primary Examiner*—Minhloan Tran
*Assistant Examiner*—Benjamin Tzu-Hung Liu

(57) ABSTRACT

A new Insulated-Gate Field-Effect Thin Film Transistor (Gated-FET) is disclosed. A semiconductor thin film Gated-FET device, comprising: a lightly doped resistive channel region formed on a semiconductor thin film layer, the thickness of the channel comprising the entire thin film thickness; and an insulator layer deposited on said channel surface with a gate region formed on a gate material deposited on said insulator layer, said gate region receiving a gate voltage comprised of: a first level that modulate said channel resistance to a substantially non-conductive state by fully depleting majority carriers from said thin film layer in the channel region; and a second level that modulate said channel resistance to a substantially conductive state by at least partially accumulating majority carriers near the gate surface of the thin film layer in said channel region.

20 Claims, 9 Drawing Sheets

U.S. PATENT DOCUMENTS

| | | |
|---|---|---|
| 6,380,009 B1 | 4/2002 | Battersby |
| 6,406,951 B1 | 6/2002 | Yu |
| 6,545,319 B2 | 4/2003 | Deane et al. |
| 6,551,885 B1 * | 4/2003 | Yu .............................. 438/300 |
| 6,579,750 B1 | 6/2003 | Krivokapic |
| 2001/0028059 A1 | 10/2001 | Emma et al. |
| 2001/0041399 A1 | 11/2001 | Bonart |
| 2002/0036320 A1 * | 3/2002 | Ichimori et al. ............ 257/347 |
| 2002/0038320 A1 | 3/2002 | Ichimori et al. |
| 2002/0079496 A1 | 6/2002 | Deane et al. |
| 2002/0168804 A1 | 11/2002 | Van der Zaag et al. |

* cited by examiner

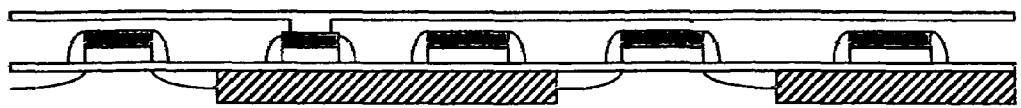
Fig-14.1
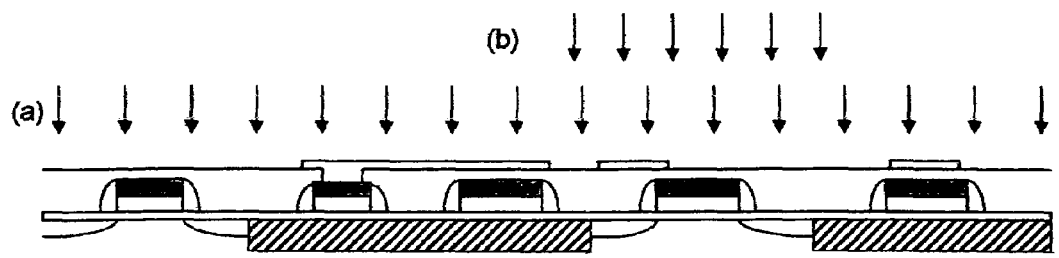
Fig-14.2
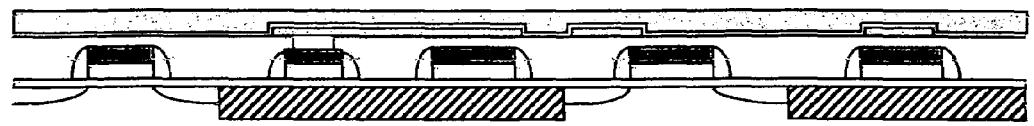
Fig-14.3
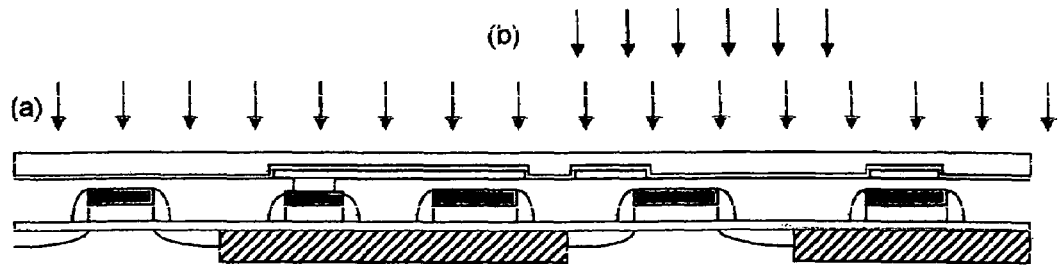
Fig-14.4

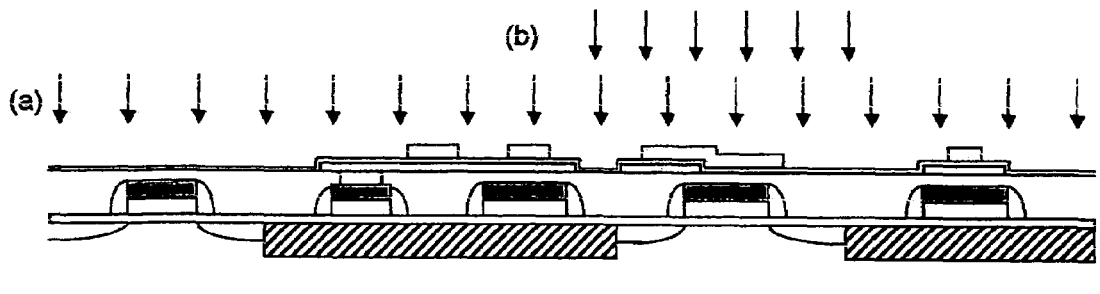
Fig-14.5
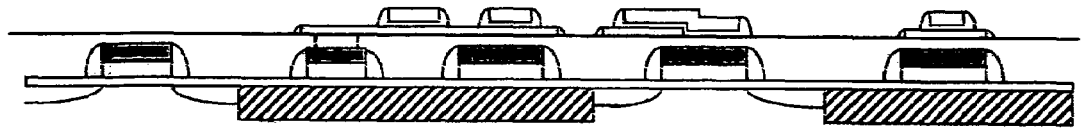
Fig-14.6
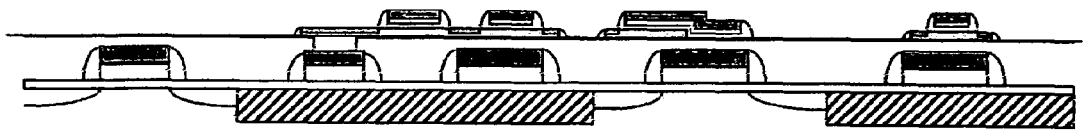
Fig-14.7
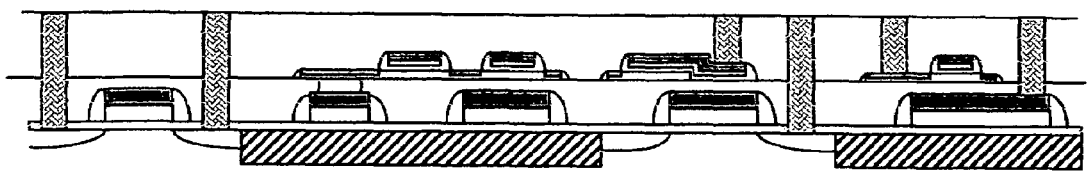
Fig-14.8

INSULATED-GATE FIELD-EFFECT THIN FILM TRANSISTORS

This application is a division of application Ser. No. 10/762,627 filed on Jan. 23, 2004, now U.S. Pat. No. 7,018,875 which is a division of application Ser. No. 10/413,808 filed on Apr. 14, 2003, now abandoned, which claims benefit from Provisional Application Ser. No. 60/393,763 filed on Jul. 8, 2002, Provisional Application Ser. No. 60/397,070 filed on Jul. 22, 2002, Provisional Application Ser. No. 60/400,007 filed on Aug. 1, 2002, Provisional Application Ser. No. 60/402,573 filed on Aug. 12, 2002, and Provisional Application Ser. No. 60/449,011 filed on Feb. 24, 2003, all of which list as inventor Mr. R. U. Madurawe and the contents of which are incorporated-by-reference.

This application is also related to application Ser. No. 10/267,484, Application Ser. No. 10/267,483, and application Ser. No. 10/267,511 now U.S. Pat. No. 6,747,478, all of which were filed on Oct. 8, 2002 and list as inventor Mr. R. U. Madurawe, the contents of which are incorporated-by-reference.

BACKGROUND

The present invention relates to semiconductor IGFET devices.

An Insulated-Gate Field-Effect Transistor, or IGFET, is a device of very major importance in the semiconductor IC industry. A Metal-Oxide-Silicon Field-Effect Transistor, or MOSFET, is a sub-class of IGFET devices. An IGFET is a four terminal device comprising of a source, drain, gate and body nodes; though the body node only allows very limited access to the device. MOSFETs are widely used in the sub micron semiconductor processing technologies to manufacture Ultra Large Scale Integrated Circuits. Ability to form Silicon-oxide interfaces with very low interface states, quality gate oxides with low thickness, reductions in system voltage and reductions in lateral geometries by lithography improvements have all contributed to the popularity of these transistors. Today MOSFETs are used to build ASICs, Memory, FPGA, Gate Array, Graphics, Micro Processors, and a wide variety of semiconductor IC products.

IGFET differ from a Bipolar Transistor in the power level and power amplification available in the device. Bipolar transistor is a three terminal device with a base, an emitter and a collector node. Compared to the base control terminal of a Bipolar traitor, the gate control terminal of IGFET consumes essentially no power. While the Bipolar can deliver more output power, the gain (defined by the ratio of output current to control current) is infinite for IGFET compared to about 500 for a good Bipolar transistor. This high gain coupled with complementary MOSFET design methodology facilitates low stand-by power in ICs that have over 10 Million transistors. Bipolar is used to build many Analog and Linear ICs such as voltage regulators, power amplifiers, rectifiers, battery regulators, D to A Converters and A to D Converters due to the high output power available. Sub-micron geometry MOSFETs with high current drives are now increasingly used for similar applications.

IGFET differs from a JFET, also a three terminal device, in the construction of the transistor. In the IGFET the gate is insulated above the transistor body, while in the JFET the gate is formed as a reverse biased junction above the conducting channel. The reverse bias control gate junction consumes a low level of power due to carrier recombination inside the depleted region. The JFET power amplification is better than a Bipolar, but lower than an IGFET. A significant difference between IGFET and JFET occurs in the method of channel conduction. This will be discussed in detail next.

The MOSFET operates by conducting current between its drain and source through a conducting inversion layer created by the presence of a gate voltage. FIG. 1 shows a cross section of a MOSFET device, and is described herein with reference to an NMOSFET device. In FIG. 1, an NMOS transistor body 100 is P− doped, isolating an N+ doped source region 113 and an N+ doped drain region 114. The source is connected to a first voltage 103, which may be the ground supply $V_S$. The drain is connected to a second voltage 104, which may be a switching voltage node for the device. The body region between source and drain under the gate 112 is also doped P type same as substrate. The result is the formation of two N+/P− back-to-back reverse-biased diodes. When the voltage 102 at gate 112 is zero, or below a threshold voltage $V_{TN}$, the N+/P− back-to-back reverse-biased diodes do not conduct and the transistor is off. The surface under gate 112 consists of hole carriers. In the embodiment of FIG. 1, the gate 112 includes a salicided region shown shaded, and the source and drain salicidation is not shown. When the gate voltage is greater than a threshold voltage ($V_{TN}$), an inversion 110 occurs under gate 112. This inversion layer, called a conducting channel, completes an electron carrier path between the source 103 and drain 104 regions. For the MOSFET in FIG. 1, the terminology inversion layer and conducting channel is used interchangeably, and is shown by 110. This conducting channel facilitates current flow between source 113 and drain 114 regions. Hole carrier depletion occurs adjacent to the body region 100 under the inversion layer 110 and adjacent to source 113 and drain 114 regions. This is shown shaded in FIG. 1. This charge is due to the reversed bias electric fields from the gate, source and drain voltages. The component of this depleted charge from the gate voltage determines the magnitude of the $V_{TN}$. Trapped oxide charge and Silicon defects affect the $V_{TN}$ transistor parameter. The more positive the voltage is at the gate, the stronger is the inversion layer charge and hence the channel conduction. At all levels, the substrate 100 potential is kept at the lowest voltage level. In most applications, the substrate and source are held at $V_S$. For special applications, the NMOS body can be pumped to a negative voltage.

A PMOS device is analogous to an NMOS device, with the device operational polarity and doping types reversed. A PMOS is on when the gate is in the voltage range from system ground $V_S$ to a threshold difference ($V_D$−$V_{TP}$), and off when the gate is in the voltage range ($V_D$−$V_{TP}$) to system power voltage $V_D$. Channel conduction is between P+ doped source and P+ doped drain, via a surface inversion P− layer. The body region originally doped N− gets depleted by the gate potential. The body region for a PMOS is termed Nwell and is constructed on a P type substrate wafer as an isolated island. The Nwell is biased to the highest PMOS device potential, and in most applications the source and Nwell are held at $V_D$. For special applications, the PMOS body can be pumped to a voltage higher than the power supply voltage.

In a MOSFET device, there is a body region 100 under the gate. In fact, a conducting channel is not formed until the surface is in inversion with a build up of minority carriers The gate depletes the body region near the surface to create this inversion layer at the surface. The depletion width reaches a maximum depth at the onset of inversion, and stays constant at higher gate biases. As the body extends well into the bottom surface of the substrate, the gate modulation has little impact on the resistance of the body region between the source and drain regions. A special case of a MOSFET is a depletion device. In the NMOS depletion device, an N− implanted channel is formed under the gate on the device body surface between N+ source and N+ drain regions. This depletion device has a negative threshold voltage, and a negative gate voltage is needed to turn the device off. The channel is modulated by two terminals: the gate above the oxide, and the body below the channel. The body below has a significant impact on the channel resistance, and in some depletion devices a negative body bias is needed to turn the depletion device off completely.

As discussed in U.S. Pat. No. 5,537,078, conventional JFET transistors are of two main types: P-channel (PJFET) and N-channel (NJFET). FIG. 2 shows a cross section of a JFET device. The description that follows is for an NJFET device. In FIG. 2, a semiconductor channel 206 which has been doped N− is positioned between two N+ diffusions 213 and 214. These diffusion nodes are connected to two terminals 203 and 204 respectively. The terminal supplying the majority carrier to the channel (which is the lowest potential) is designated the source (S) while the other terminal is designated the drain (D). Across the N− channel 206 there are two gates which are referred to as the top gate 212 and the bottom gate 222. Top gate is connected to terminal 202, and the bottom gate is connected to terminal 232. In some embodiments, the two gate terminals 202 and 232 may be common. Each gate is doped with P+ type dopant to create two back to back P+/N− diodes perpendicular to the channel. When drain and source voltages are different, the drain to source current passes entirely through the conducting N− channel 206. This current increases with higher voltage drop between the terminals, reaching a saturation value at high biases. At saturation, the depletion regions meet at a pinch-off point 230 near the drain edge as shown in FIG. 2. The gates are biased to keep the gate to channel P+/N− junctions reversed biased. The reversed biased voltage creates depletion regions 210 and 220 that penetrate into the channel reducing the channel height available for current flow. The gate voltages also control the flow of current between the source and drain by modulating the channel height. When the gate reverse bias is sufficiently large, the entire channel is pinched-off causing no current flow between drain and source. In on and off states, there is no current flow through the gate terminal of a JFET due to reverse bias junction voltages, except for junction leakage current. For the device in FIG. 2 a negative gate voltage (lower than $V_S$) creates the channel off condition. Such a negative gate voltage increases the operating voltage of this process, a draw back for JFET scheme.

A PJFET device is analogous to an NJFET device, with the device operational polarity and doping types reversed. A PJFET is on when the gate is at $V_D$, and off when the gate is more positive than $V_D$ further increasing the voltage level of the process. Channel conduction is between P+ doped source and drain regions via a P− doped channel sandwiched between two N+ doped gate regions. For source and drain terminals at voltages in the range from $V_S$ to $V_D$, operating range of NJFET gate is less than $V_S$ to $V_S$, while the operating range for PJFET gate is $V_D$ to more than $V_D$.

Compared to the non-conducting body 100 of MOSFET on FIG. 1, the JFET has a conducting channel 206 between source and drain. Due to non-overlapping gate voltages and the high voltage range thus needed, a complementary JFET process is impractical to realize. Hence there is no low cost process that provides CJFET devices analogous to CMOS devices. Compared to the MOSFET in FIG. 1, a JFET conducting channel is formed inside the body of the switching device. This channel current is not affected by trapped oxide charges near the gate, a draw back with MOSFETs. Compared to MOSFETs, JFETs also have poorer switching characteristics due to higher depleted charge stored in the channel and the transient times required to store and remove this depletion charge. Reverse biased junctions hurt JFET device ease of use and popularity in modern day ICs.

A special MOSFET device constructed in Silicon-on-Insulator (SOI) is shown in FIG. 3. This three terminal device is constructed as either an NMOSFET or a PMOSFET. The difference in FIG. 1 and FIG. 3 is in the thickness of the body region 306 of the device, and in its body isolation. In the SOI device, the regions 313, 306 and 314 are constructed on a thin film semiconductor material. The substrate 300 is isolated from the device region by insulator 307, hence there is no fourth terminal to this device. This isolation helps with lower junction capacitance and no body effect for SOI MOSFET. Source 313, drain 314, gate 312, spacer 320, and salicided regions 322 and 325 are all similar to the standard MOSFET in FIG. 1. Two conditions differ in SOI MOSFET when the device in on. In PD SOI, the body 306 is only partially depleted (PD) when the body is thicker than a maximum depletion width Then a neutral floating body exists inside region 306 causing deleterious effects on device performance. For thinner FD SOI devices the body is fully depleted (FD) and a neutral body region does not occur. These tend to show short channel effects from the drain and source reverse biased depletions into body region.

Analogous to standard MOSFET, SOI MOSFET also has a non-conducting body under the gate 312. The channel 310 is only formed by inverting the surface. The body 306 is fully isolated with no access points. The gate modulation of the body has no influence to access ports. Unlike the body, the conducting channel can be accessed via source and drain nodes. There is no analogous device to depletion MOSFET in SOI. This is due to the floating body in an SOI and the inability to control body voltage. Depletion device behavior strongly depends on the body voltage control.

SUMMARY

In one aspect, a semiconductor Gated-FET device comprises of a lightly doped resistive channel region formed on a first semiconductor thin film layer; and an insulator layer deposited on said channel surface with a gate region formed on a gate material deposited on said insulator layer; said gate region receiving a gate voltage having a first level modulating said channel resistance to a substantially non-conductive state and a second level modulating said channel resistance to a substantially conductive state.

In a second aspect said channel region is formed between a source region and a drain region in the said first semiconductor thin film; and said source region coupled to a source voltage; and said drain region coupled to a drain voltage; and said source and drain regions having a higher level of the same dopant type as said channel region.

In a third aspect, the Gated-FET device further comprises of an off state with said gate voltage below a first threshold voltage level, and said thin film channel substantially not conducting a current between said drain and source regions for a differential bias voltage ranging from zero to a system power supply voltage; and an on state with said gate voltage above a first threshold voltage level, and said thin film channel substantially conducting a current between said drain and source regions for a differential bias voltage ranging from zero to a system power supply voltage.

The Gated-FET device is a subset of IGFET devices where the gate is insulated from the channel. This terminology is used to distinguish the new device from MOSFET and JFET devices. A Gated-FET device is a hybrid device between an SOI MOSFET device and a conventional JFET device. The Gated-FET device has a channel region like that of the JFET device: entirely comprising of a thin film resistive channel between its source and drain regions. There is no inversion layer like in an SOI MOSFET to conduct current with no floating body. The gate node of the Gated-FET device is like that of a MOSFET device: the gate constructed above a dielectric material insulating gate from the channel. There is no reverse biased gate junction like in a JFET. The gate voltage thus modulates the channel through the oxide similar to the gate modulation of the SOI MOSFET body region. Unlike in the SOI MOSFET, this modulation occurs in the channel region, which connects the source and drain regions.

Advantages of the invention may include one or more of the following. A Gated-FET device is used with no increase in voltage range compared to JFET. A Gated-FET device has a threshold voltage not degraded by fixed charge and surface states. A Gated-FET has a channel conductance not degraded by lower surface mobility. A Gated-FET channel current is better controlled with thin film physical properties such as thickness, doping and work function. A Gated-FET has lower charge storage in the channel and faster switching speeds. A Gated-FET has only one gate. A Gated-FET has very low junction capacitance and no body effect. A Gated-FET has no isolated body and no charge trapping effects. A Gated-FET is constructed in a second semiconductor plane, different from a first plane used for logic transistor construction. A Gated-NFET and a Gated-PFET is built on the same process. Gated-FETs are used to build 3D dense integrated circuits. Complementary Gated-FET devices are fabricated in conjunction with regular CMOS devices in a single process. A Gated-NFET and Gated-PFET share a common drain node on a single geometry. The CGated-FETs share a common gate voltage. A switching device is built as a CGated-FET inverter. The CGated-FET inverter has identical gate voltage range as power supply voltage. A latch is constructed with two CGated-FET inverters connected back to back.

An off-state Gated-FET thin film transistor body is filly depleted. The depleted channel resistance is non-conductive with no current flow between source and drain. An on-state Gated-FET has a surface accumulation. The accumulation enhances the channel conduction beyond the original dopant level. The enhanced Gated-FET channel conduction is 2 to 100 times more than the intrinsic channel conductance. Thin film Gated-FET has superior device on and off characteristics.

The method of fabricating the Gated-FET may have one or more of following advantages. A Gated-FET is constructed with III-V semiconductor material. A Gated-FET is constructed with poly-crystalline semiconductor thin film transistors. A Gated-FET is constructed with amorphous poly-Silicon semiconductor thin film transistors. A Gated-FET is constructed with laser re-crystallized poly-Silicon semiconductor thin film transistors. A Gated-FET is constructed on SOI material, or thinned down region of SOI material. A thinned down crystalline SOI Gated-FET has very high performance. The Gated-FET is fabricated in poly-crystalline Silicon layers with good on and off device characteristics. A circuit may be constructed with a conventional MOSFET device, and a new Gated-FET vertically integrated. A TFT module layer may be inserted to a logic process module. The TFT module layer may be inserted to SOI process module. The module insertion may be at a first contact layer. The module insertion may be at a later via layer.

Implementation of the new device may have one or more following advantages. Gated-FETs are used to build circuits and latches. Inexpensive latches are built with 3D integrated Gated-FET devices. Latches are vertically integrated to a logic process for FPGA applications. A split latch is constructed with regular MOSFET in a first layer, and vertically integrated Gated-FET in a second layer connected back to back. A split latch is used to construct high density SRAM memory. A split SRAM memory is used for high memory content FPGA applications. A split SRAM is used for high density stand alone memory. The split level latch cells have very high performance similar to full CMOS latches. The split level latches have very low power consumption similar to full CMOS SRAM memory. New latches can be used for very fast access embedded memory applications. Thinned down split latch SOI memory allows very high memory densities. The complete TFT latch can be stacked above logic transistors, further reducing Silicon area and cost Full TFT latches have longer access times, but useful for slow memory applications. Slow TFT latches can be used in PLDs (Programmable Logic Devices) and subsequently mapped to ASICs (Application Specific Integrated Circuit). The PLDs are used for prototyping and low volume production, while the ASICs are used for high volume production. Programmable TFT latches are used in PLD's. Programmable elements are replaced with hard wires in ASICs.

The invention thus provides an attractive solution for two separate industries: (i) very high density stand alone or embedded low power, fast access SRAM memory and (ii) high-density, low-cost SRAM for PLD and FPGA with convertibility to ASIC. It also provides an alternative set of complementary devices to a traditional SOI MOSFET process for very high density integrated circuit fabrication.

BRIEF DESCRIPTION OF THE DRAWINGS

FIG. 14.1-FIG. 14.8 show constructional cross sections of processing steps showing fabrication of complementary Gated-FET devices.

DESCRIPTION

The terms wafer and substrate used in the following description include any structure having an exposed surface with which to form the Gated-FET structure of the invention. The term substrate is understood to include semiconductor wafers. The term substrate is also used to refer to semiconductor structures during processing, and may include other layers that have been fabricated thereupon. The term layer is used for processing steps used in the manufacturing process. The term layer also includes each of the masking layers of the process. Both wafer and substrate include doped and undoped semiconductors, epitaxial semiconductor layers supported by a base semiconductor or insulator, SOI material as well as other semiconductor structures well known to one skilled in the art. The term conductor is understood to include semiconductors, and the term insulator is defined to include any material that is less electrically conductive than the materials referred to as conductors. The term geometry is used to define an isolated pattern of a masking layer. One mask layer is a collection of geometries in the mask pattern. The term module includes a structure that is fabricated using a series of predetermined process steps. The boundary of the structure is defined by a first step, one or more intermediate steps, and a final step. The term channel is used to identify a region that connects two other regions. The term body identifies a region common to a plurality of devices. The term body is also used to identify a substrate or a well region. The term body is also used to identify a region other than a conducting region. The following detailed description is, therefore, not to be taken in a limiting sense.

Figure 1:
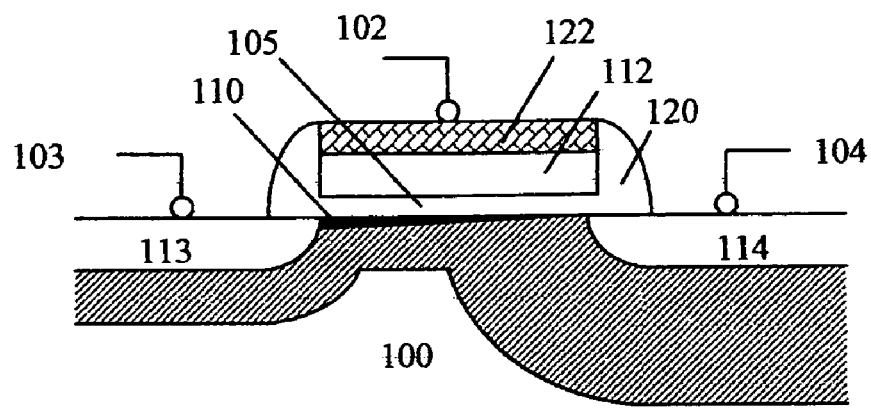
FIG. 1 shows a conventional MOSFET device conduction channel.
Figure 2:
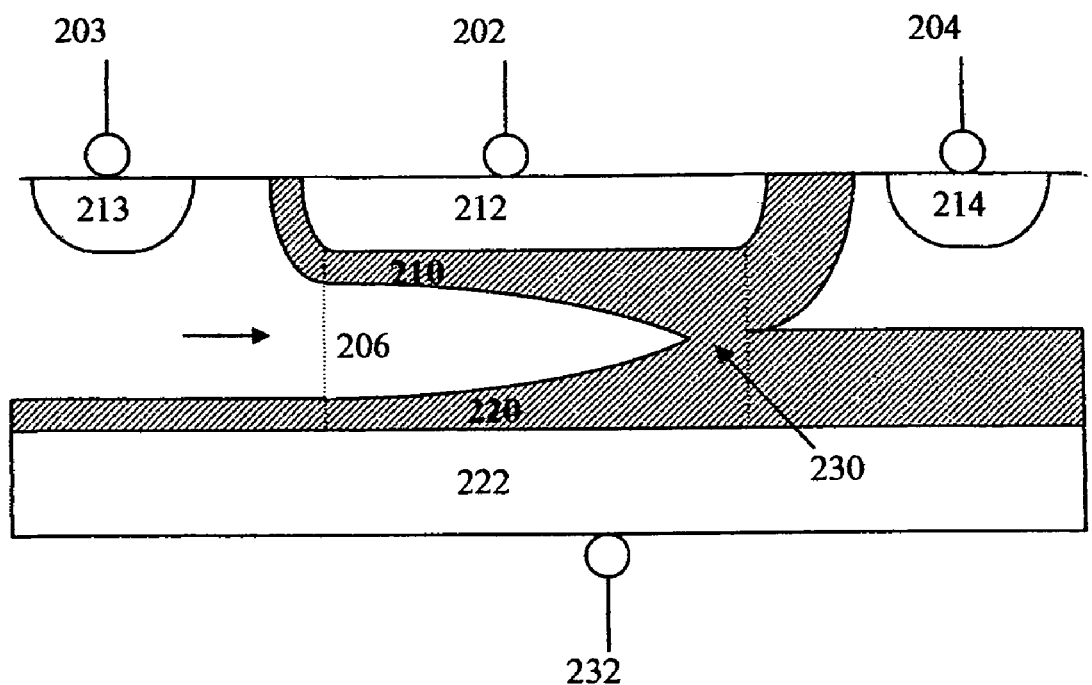
FIG. 2 shows a conventional JFET device conduction channel.
Figure 3:
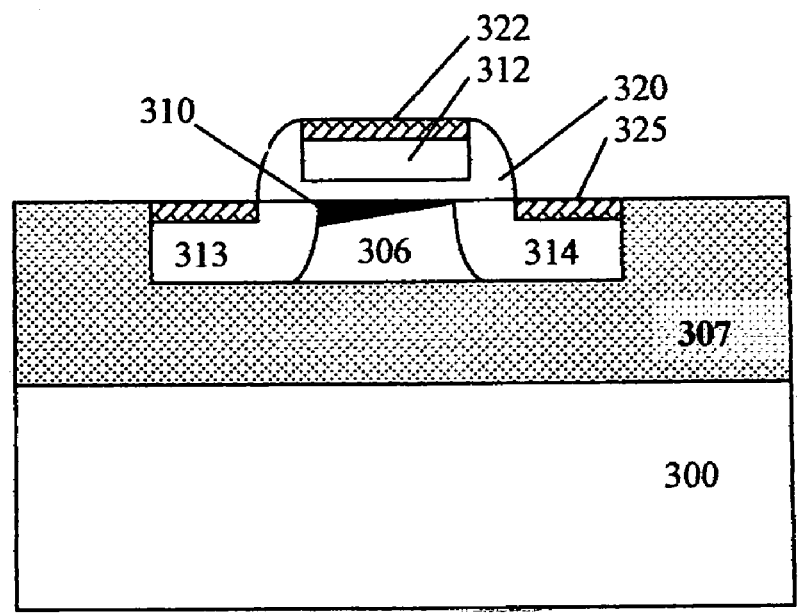
FIG. 3 shows a conventional SOI MOSFET device.
Figure 4:
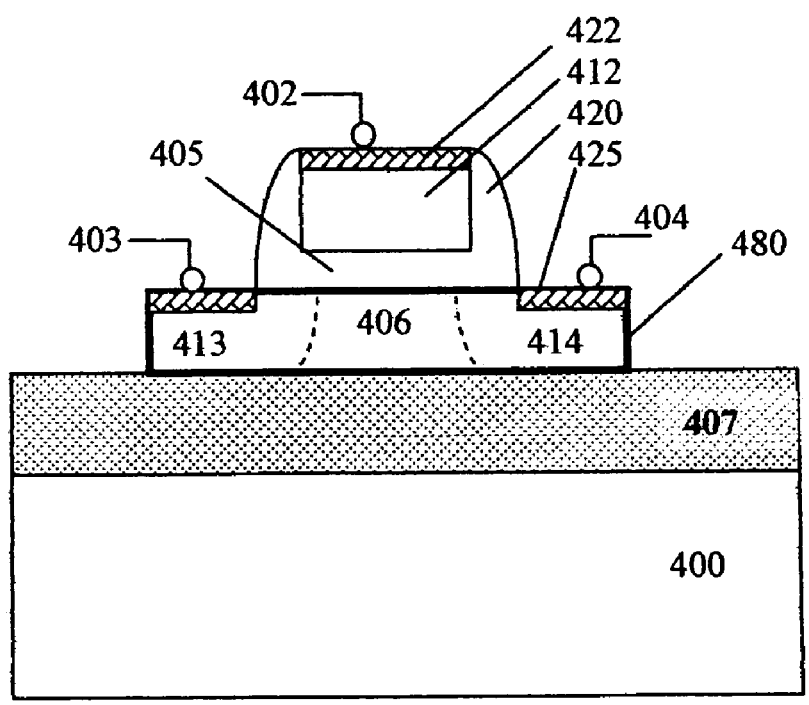
FIG. 4 shows a Gated-FET device.

One embodiment of the Gated-FET is shown in FIG. 4. This device differs from the MOSFET shown in FIG. 1 in three aspects: absence of an inversion layer at the surface, absence of a body region and the thinness of the channel region. This device differs from the JFET device shown in FIG. 2 in three aspects: absence of diffused gate junction, absence of dual gates, and presence of an insulated gate. This device differs from the SOI MOSFET shown in FIG. 3 in at least two aspects: absence of an inversion layer at the surface, absence of a floating body region.

Gated-FET in FIG. 4 is comprised of a lightly doped resistive channel region 406 formed on a first semiconductor thin film layer 480; and an insulator layer 405 deposited on said channel 406 surface; and a gate region 412 formed on a gate material deposited on said insulator layer 405; and said gate region 412 coupled to a gate voltage 402; and said gate voltage 402 at a first level modulating said channel 406 resistance to a substantially non-conductive state; and said gate voltage at a second level modulating said channel 406 resistance to a substantially conductive state.

Gated-FET in FIG. 4 further comprises of said channel region 406 formed between a source region 413 and a drain region 414 in the said first semiconductor thin film 480; and said source region coupled to a source voltage 403; and said drain region coupled to a drain voltage 404; and said source and drain regions 413 and 414 having a higher level of the same dopant type as said channel region 406.

In the shown embodiment in FIG. 4, the Gated-FET device is constructed on an isolation layer 407 that is deposited on a substrate layer 400. In a preferred embodiment the isolation layer 407 is an insulator. In another embodiment, isolation layer 407 is a semiconductor material, a body region with opposite type dopant to reverse bias and isolate regions 413, 406 and 414. The substrate 400 can be doped P type or N type, and contain N-well, P-well and any other diffused region. In another embodiment, the substrate 400 also contains other transistors constructed upon the substrate surface and isolated by the region 407. In FIG. 4 the gate 412, drain 414 and source 413 regions are shown salicided. These salicided regions for the gate and drain are shown as 422 and 425. In another embodiment these are not salicided. A vertical side wall of the gate 412 is covered by a spacer 420, and the salicided region 425 is separated from the gate edge by the width of that spacer. The spacer 425 is self aligned to gate 412. Salicided region 425 is self aligned to spacer 420. The device in FIG. 4 can be either a Gated-NFET or a Gated-PFET depending on the dopant types chosen in the region 480. Regions 413, 406 and 414 have substantially the same type of dopant. Channel 406 is doped lighter than the source and drain regions 413 and 414. A gate material is chosen to satisfy a work function requirement for proper functionality of the device. Insulator 405 thickness and semiconductor 480 thickness and dopant level are optimized for device performance. Device design criteria will be discussed in detail next.

Figure 5A:
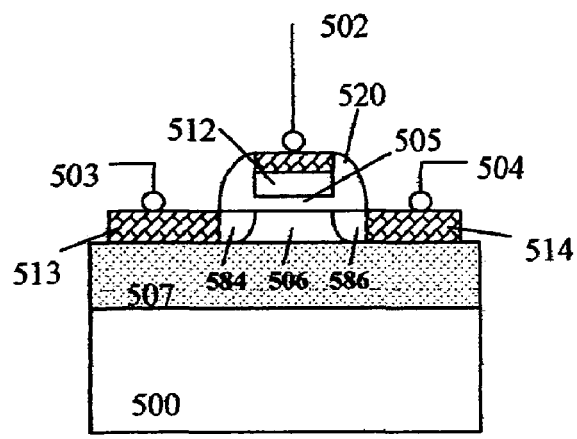
FIGS. 5A and 5B shows a cross sectional view and top view of a Gated-NFET device.
Figure 5B:
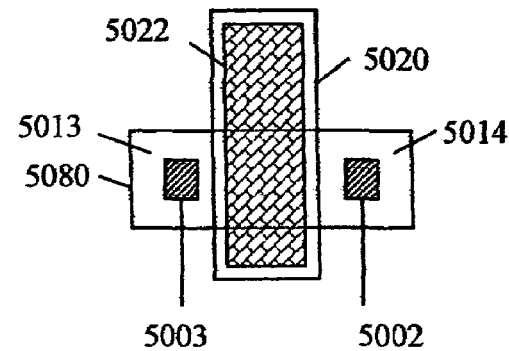

FIG. 5 shows a Gated-PFET device. Top view in FIG. 5B shows a first semiconductor geometry 5080 orthogonal to a gate geometry 5022. These two layers are separated by an insulator deposited in between. The gate geometry 5022 is surrounded by a spacer ring 5020. A source voltage 5003 is connected via a contact to source region 5013 formed on semiconductor geometry 5080. A drain voltage 5004 is connected via a contact to drain region 5014 formed on semiconductor geometry 5080. Geometry 5080 is subdivided by implant type into different regions. The separation occurs by overlapping nature of gate geometry 5022 and spacer ring 5020 above geometry 5080. The middle region under gate geometry 5022 is defined as the channel region. The two regions under the spacer ring 5020 are defined as the lightly doped drain (LDP) regions. These regions are better seen in the cross sectional view in FIG. 5A as channel region 506 and LDP regions 584 and 586. In this embodiment, the source and drain regions 513 and 514 are shown completely salicided with no P+ implanted semiconductor regions. The source and drains are entirely determined by the LDP regions 584 and 586. FIG. 5A also shows a poly-Silicon gate material 512 partially salicided. Source 513, drain 514 and gate 512 salicidations occur simultaneously and a thicker poly-Silicon film for gate 512 ensures partial consumption. Terminals 502, 503 and 504 are coupled to the regions 512, 513 and 514 respectively completing a three terminal device. There is no fourth terminal in this device as the channel 506 is electrically coupled between source 513 and drain 514. There is no body region for this device. The channel 506 height is same as the deposited semiconductor film 5080 thickness.

The operation of Gated-PFET is described next. The device has an on threshold voltage $V_{TP}$. Gated-PFET source 503 is connected to the higher voltage compared to drain 504. Device on-off is determined by gate 502 over voltage with respect to source 503. For this discussion, power supply voltage $V_D$ is taken as the higher voltage. The other voltage is taken as a ground supply voltage $V_S$. Furthermore, the source terminal 503 is assumed connected to the system power voltage $V_D$. When the gate voltage 502 is between $V_D$ and $(V_D-V_{TP})$, the device is off with no significant current flow between drain and source. When the gate voltage 502 is between $(V_D-V_{TP})$ and $V_S$ the device is on. The drain to source current flow depends on the voltage difference between the two terminals $V_{DS}$.

Figure 6A:
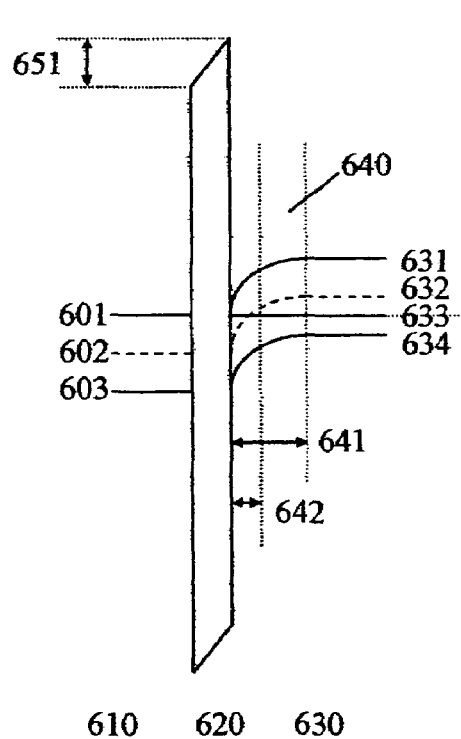
FIGS. 6A and 6B shows a band diagram for off state Gated-NFET device.

FIG. 6A shows an energy band diagrams for a Gated-PFET comprised of an N+ poly Silicon gate material 512, oxide insulator 505, and P– doped channel 506 in FIG. 5A when the gate and channel are both biased to level 600. Reference level 600 is at $V_D$ volts. This bias condition occurs near the source edge of an off Gated-PFET device with gate and source at $V_D$ voltage. Levels 601, 602 and 603 represent the conduction band, mid gap band and the valence band energy levels for N+ doped poly Silicon. For Si semiconductor, the band gap is about 1.12 eV at 300 Kelvin temperature as shown by the difference between levels 601 and 603. For N+ dopant, the Fermi level is at the conduction band level 601. Energy levels 631, 632 and 634 represent the conduction band, mid gap band and the valence band energy levels for P– channel Silicon. Again the band gap is 1.12 eV for Silicon at 300 Kelvin, shown by the energy difference between 631 and 634. The Fermi level for P– Silicon is shown by level 633. The P– Silicon has a higher vacuum level electron energy compared to N+ poly Silicon. In the diagram, no oxide charge is assumed, and the difference in energy level is the work function difference between the two materials. In the diagram work function difference is assumed to equal flat band voltage. Presence of fixed oxide charge reduces the flat band voltage. There is a net electron transfer from Silicon side to the Gate side causing band bending as shown in FIG. 6A. This creates voltage drop across the oxide and Silicon according to the laws of Semiconductor Physics. The total voltage drop equals the flat band voltage $V_{FB}$. The voltage drop in the oxide is shown by the difference 651 with a uniform electric field in the absence of fixed charge inside the oxide. The voltage drop inside Silicon creates a band bending region 640 with a depth 641 into Silicon from the oxide interface. This region is depleted of majority carrier holes. There is no supply of minority carriers (an N type diffusion region) to cause a surface inversion layer and pin the band bending at the surface as shown by region 110 in FIG. 1 for a MOSFET device. In FIG. 6A, a thickness 642 is shown to be significantly depleted of carriers. That region has no conducting majority carrier holes. Choosing an appropriate Silicon channel height 642 allows building a Gated-PFET channel that does not conduct when a $V_D$ voltage is applied on the gate.

Figure 6B:
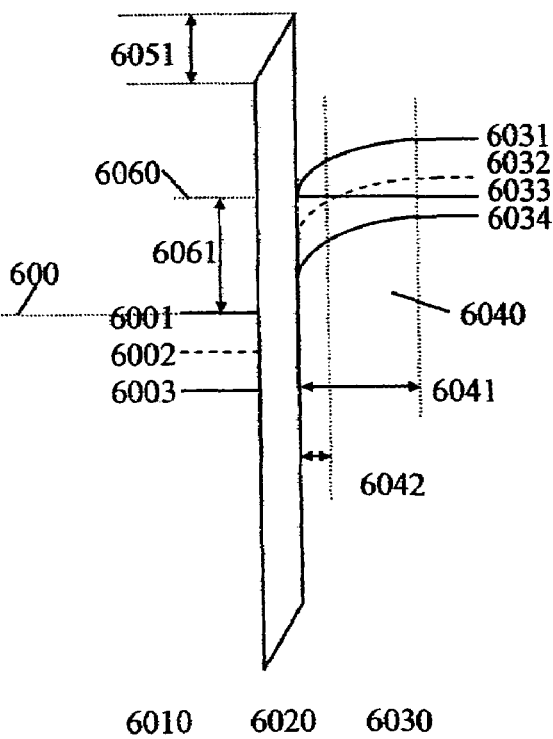

FIG. 6B is a Gated-PFET energy band diagram when the gate is at $V_D$ and the channel at zero or $V_S$ volts. This condition can occur at the drain edge of an off Gated-PFET when the drain has to support $V_S$. In FIG. 6B, the Silicon Fermi level 6033 is at $V_S$ while the gate Fermi level 6001 is at $V_D$. The two Fermi levels 6033 and 6001 are separated by the bias voltage 6061 which has a value $V_D$. The depletion region 6040 is deeper than 640, extending to a depth 6041 into the Silicon. A thin layer channel that is fully depleted in FIG. 6A remains filly depleted in FIG. 6B. Such a channel has no conduction between a source and a drain that are biased to $V_D$ and $V_S$ voltages respectively. Regardless of drain voltage, the Gated-PFET is off when the gate is at $V_D$. This can be seen by the increased band bending shown in FIG. 6B.

As the gate voltage decrease from $V_D$ to a value ($V_D$–$V_{TP}$), the voltage drop across the oxide decreases, and the Silicon depletion width 641 also decreases. $V_{TP}$ is chosen such that there is a clear noise margin on the threshold level of the Gated-PFET against power and ground voltage variations. At that threshold, the depletion width 641 falls to within the film thickness 642 shown in FIG. 6A at the source edge. That creates an onset of conduction current between the source and drain, even if the drain edge is still fully depleted and pinched off. The drain edge pinch off contributes to creating a saturation current.

Figures 7A, 7B:
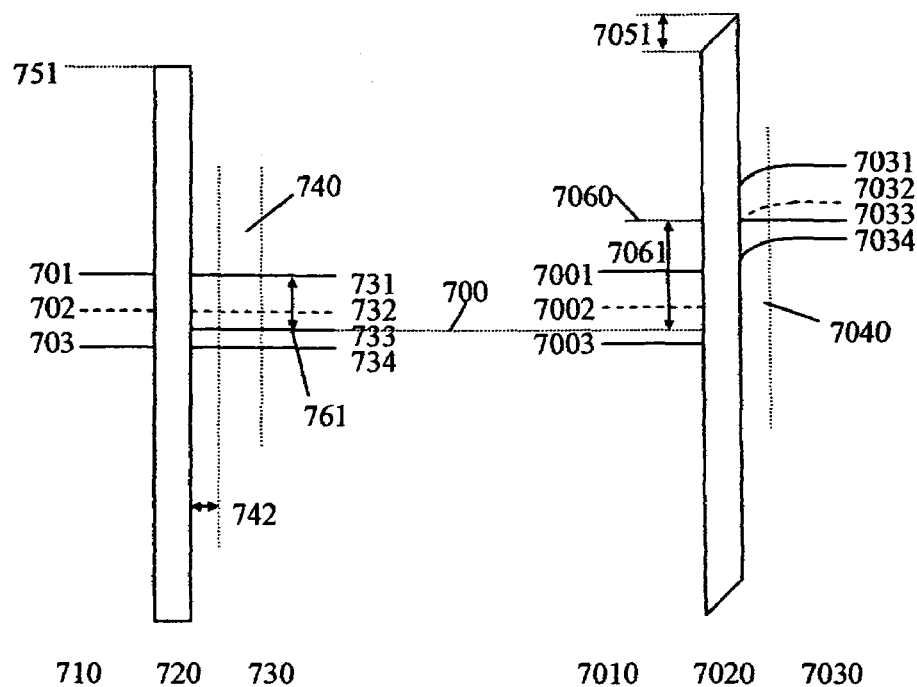
FIGS. 7A and 7B shows a band diagrams for a first on state Gated-NFET device.

At a gate voltage higher than the threshold the bands attain a flat band level as shown in FIG. 7A. This flat band voltage is defined $V_{FB}$ and is shown by voltage level 761. In FIG. 7A the gate is biased to $V_{FB}$ while the channel is held at $V_D$. Hence, Fermi level 733 in the Silicon is at $V_D$, while the Fermi level of N+ poly is at $V_{FB}$. The voltage drop across the oxide 751 is zero, and the band bending in the Silicon is also zero. When there is no fixed oxide charge in the oxide, $V_{FB}$ equals the work-function difference between gate and Silicon. There is no meaning to a depletion region under this bias condition, and the entire Silicon film thickness 742 has majority carriers at the doping level of the Silicon. This is seen by the flat Fermi level 733 in FIG. 7A. FIG. 7B shows the gate at $V_{FB}$ and the channel at drain edge biased to $V_S$. Silicon Fermi level 7033 is at zero ($V_S$) volts, while Gate Fermi level 7001 is at $V_{FB}$. Voltage level 7061 shows the applied channel voltage $V_S$ against reference level 700 at $V_D$. The over voltage between $V_{FB}$ and $V_S$ is now dropped across the oxide and the Silicon creating a depletion region 7040 in Silicon. Such depletion causes a current saturation in the conducting channel. Hence at a bias $V_G=V_{FB}$, the Gated-PFET conducts with a current saturation occurring at a voltage when the channel depth is pinched-off near the drain edge.

Figures 8A, 8B:
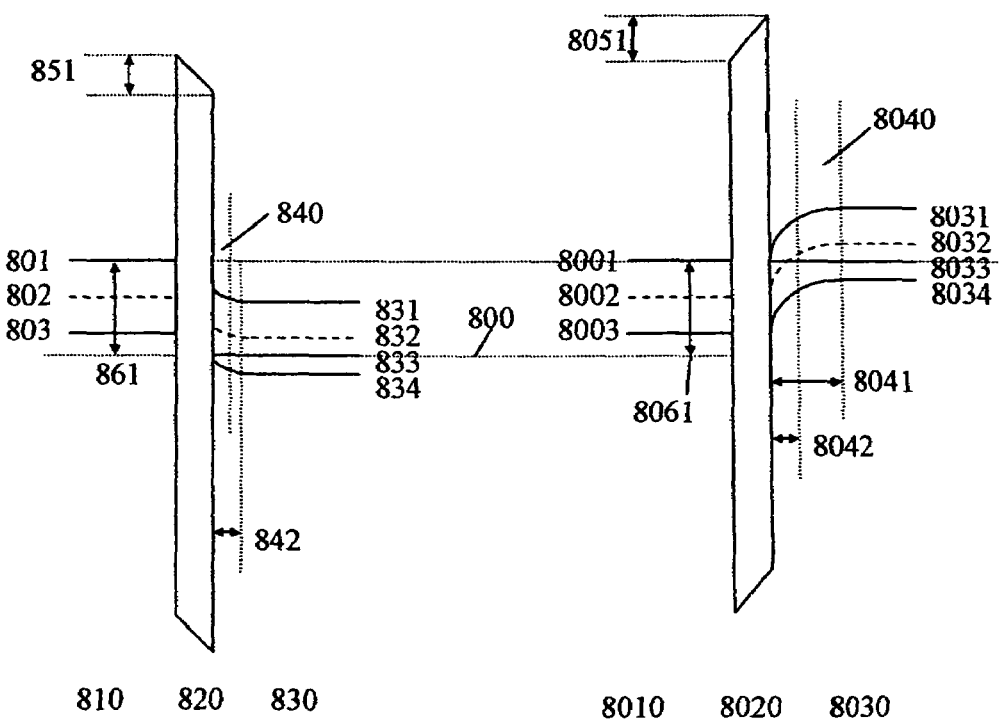
FIGS. 8A and 8B shows a band diagrams for a second on state Gated-NFET device.

A Gated-PFET with a gate biased at ground ($V_S$) is shown in FIGS.-8A and 8B. In FIG. 8A the channel near source edge is at voltage $V_D$. Gate Fermi level 801 is at $V_S$, while the channel Fermi level 833 is at $V_D$. The over voltage between $V_{FB}$ and $V_D$ is now dropped across the oxide and the Silicon creating an accumulation region 840 near the channel surface. The majority carrier concentration is now far higher than the original doping level of the Silicon layer. This provides enhanced channel conduction beyond the doping level chosen for the film. The channel film thickness 842 is chosen thicker than the accumulation width to facilitate a strong on current for the Gated-PFET. FIG. 8B shows the gate and channel both at $V_S$. Both Fermi levels 8001 and 8033 are at $V_S$, above reference level 800 by a value $V_D$. The band diagram is identical to FIG. 6A when both sides were biased at $V_D$. Again the drain edge of the channel is pinched-off demonstrating the existence of current saturation in the device.

The diagrams shown in FIGS. 6, 7 and 8 have consistent labels. All diagrams consistently show the existence of a thin film channel region that will allow construction of a Gated-PJFET device by ensuring an on state and an off state. The channel is fully depleted of majority carriers in the off state. The gate and the semiconductor material properties need to be chosen to ensure this condition. The flat band voltage for the system needs to be large enough to fully deplete the chosen channel thickness when the device is off. In the embodiment chosen an N+ doped poly Silicon gate material, an oxide dielectric and a P– doped Silicon channel meets that condition. A thinner dielectric thickness and a lower dielectric constant material for the gate insulator allow a lower voltage loss across the dielectric and a larger channel modulation in the Silicon.

Figure 9A:
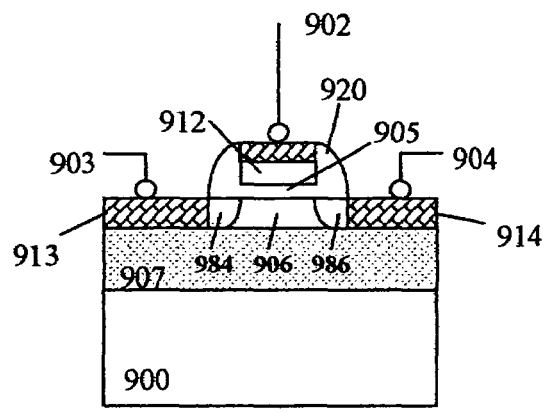
FIGS. 9A and 9B shows a cross sectional view and top view of a Gated-PFET device.
Figure 9B:
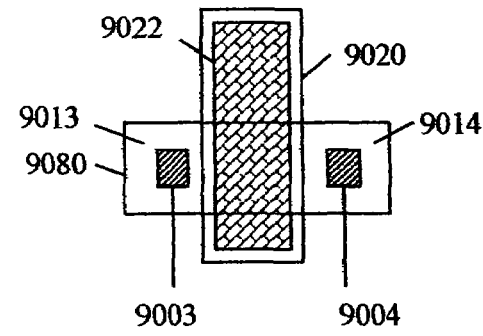

Next we will discuss a Gated-NFET device as shown in FIG. 9. Top view in FIG. 9B shows a first semiconductor geometry 9080 orthogonal to a gate geometry 9022. These two layers are separated by an insulator deposited in between. The gate geometry 9022 is surrounded by a spacer ring 9020. A source voltage 9003 is connected via a contact to source region 9013 formed on semiconductor geometry 9080. A drain voltage 9004 is connected via a contact to drain region 9014 formed on semiconductor geometry 9080. Geometry 9080 is subdivided by implant type into different regions. The separation occurs by overlapping nature of gate geometry 9022 and spacer ring 9020 above geometry 9080. The middle region under gate geometry 9022 is defined as the channel region. The two regions under the spacer ring 9020 are defined as the lightly doped drain (LDN) regions. These regions are better seen in the cross sectional view in FIG. 9A as channel region 906 and LDN regions 984 and 986. In this embodiment, the source and drain regions 913 and 914 are shown completely salicided with no N+ implanted semiconductor regions. The source and drains are entirely determined by the LDN regions. FIG. 9A also shows a poly-Silicon gate material 912 partially salicided. Source 913, drain 914 and gate 912 salicidations occur simultaneously and a thicker poly-Silicon film for gate 912 ensures partial consumption. Terminals 902, 903 and 904 are coupled to the regions 912, 913 and 914 respectively completing a three terminal device. There is no fourth terminal in this device as the channel 906 is electrically coupled between source 913 and drain 914. There is no body region for this device. The channel 906 height is same as the deposited semiconductor film 9080 thickness.

The operation of Gated-NFET is described next. The device has an on threshold voltage $V_{TN}$. Gated-NFET source 903 is connected to the lower voltage compared to drain 904. Device on-off is determined by gate 902 over voltage with respect to source 903. For this discussion, ground supply voltage $V_S$ is taken as the lower voltage. The other voltage is taken as a power supply voltage $V_D$. Furthermore, the source terminal 903 is assumed connected to the system ground voltage $V_S$. When the gate voltage 902 is between $V_S$ and $V_{TN}$, the device is off with no significant current flow between drain and source. When the gate voltage 902 is between $V_{TN}$ and $V_D$ the device is on. The drain to source current flow depends on the voltage difference between the two terminals $V_{DS}$.

Figures 10A, 10B:
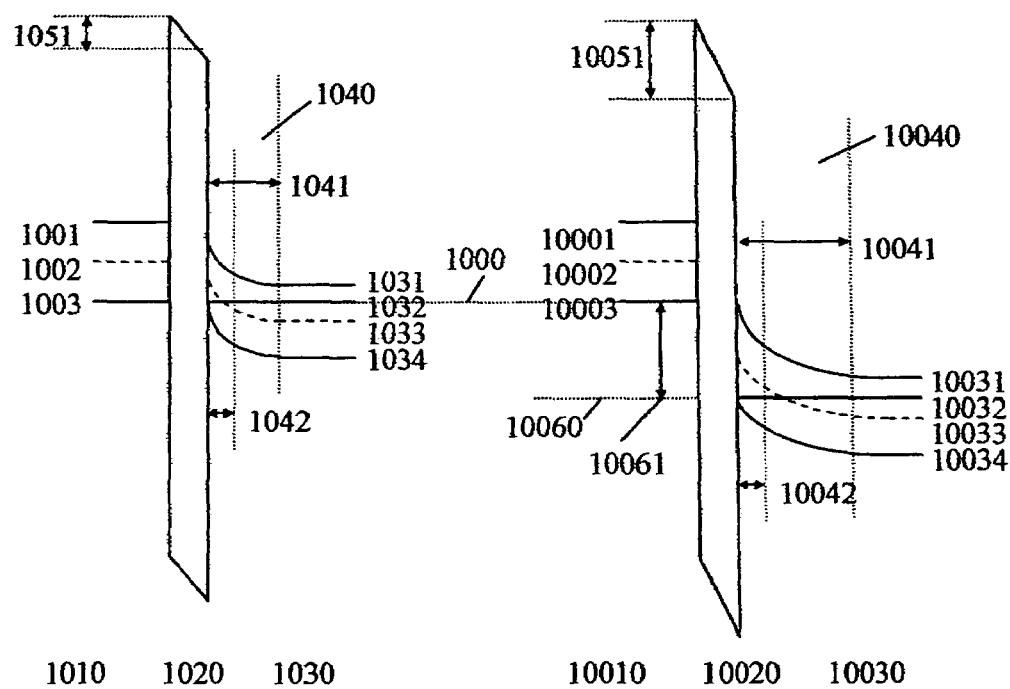
FIGS. 10A and 10B shows a band diagram for off state Gated-PFET device.

FIG. 10A shows an energy band diagrams for a Gated-NFET comprised of a P+ poly Silicon gate material 1010, oxide insulator 1020, and N− doped channel 1030 when the gate and channel are biased at $V_S$ volts at level 1000. This bias condition occurs near the source edge of an off device with gate and source at $V_S$ voltage. Levels 1001, 1002 and 1003 represent the conduction band, mid gap band and the valence band energy levels for P+ poly Silicon. For Si semiconductor, the band gap is about 1.12 eV at 300 Kelvin temperature as shown by the difference between levels 1001 and 1003. For P+ dopant, the Fermi level is at the valence band level 1003. Energy levels 1031, 1033 and 1034 represent the conduction band, mid gap band and the valence band energy levels for P− channel Silicon. Again the band gap is 1.12 eV for Silicon at 300 Kelvin, shown by the energy difference between 1031 and 1034. The Fermi level for N− Silicon is shown by level 1032. The N− Silicon has a lower vacuum level electron energy compared to P+ poly Silicon. In the diagram, no oxide charge is assumed, and the difference in energy level is the work function difference between the two materials. There is a net electron transfer from Gate side to the Silicon side causing band bending as shown in FIG. 10A. This creates voltage drop across the oxide and Silicon according to the laws of Semiconductor Physics. The voltage drop in the oxide is shown by the difference 1051 with a uniform electric field in the absence of fixed charge inside the oxide. The voltage drop inside Silicon creates a band bending region 1040 with a depth 1041 into Silicon from the oxide interface. This region is depleted of majority carrier electrons. There is no supply of minority carriers (a P type diffusion region) to cause a surface inversion layer and pin the band bending at the surface as shown by region 110 in FIG. 1 for a MOSFET device. In FIG. 10A, a thickness 1042 is shown to be significantly depleted of carriers near the surface. That region has no conducting majority carrier electrons. Choosing an appropriate Silicon channel height 1042 allows constructing a Gated-NFET channel that does not conduct when a $V_S$ voltage is applied on the gate.

FIG. 10B is a Gated-NFET energy band diagram when the gate is at $V_S$ and the channel at $V_D$ volts. This can occur at the drain edge of an off Gated-NFET when the drain has to support a voltage $V_D$. In FIG. 10B, the Silicon Fermi level 10032 is at $V_D$ while the gate Fermi level 10003 is at $V_S$. The two Fermi levels 10032 and 10003 are separated by the bias voltage 10061 which has a value $V_D$. The depletion region 10040 is deeper than 1040, extending to a depth 10041 into the Silicon. A thin layer channel that is filly depleted in FIG. 10A remains fully depleted in FIG. 10B. Such a channel has no conduction between a source and a drain that are biased to $V_S$ and $V_D$ voltages respectively. Regardless of drain voltage, the Gated-NFET is off when the gate is at $V_S$. This can be seen by the enhanced band bending shown in FIG. 10B.

As the gate voltage increase from $V_S$ to a value $V_{TN}$, the voltage drop across the oxide decreases, and the Silicon depletion width also decreases. $V_{TN}$ is chosen such that there is a clear noise margin on the threshold level of the Gated-NFET against power and ground voltage variations. At that threshold, the depletion width 1041 falls to within the film thickness 1042 shown in FIG. 10A at the source edge. That creates an onset of conduction current between the source and drain, even if the drain edge is still fully depleted and pinched off. The drain edge pinch off contributes to creating a saturation current.

Figures 11A, 11B:
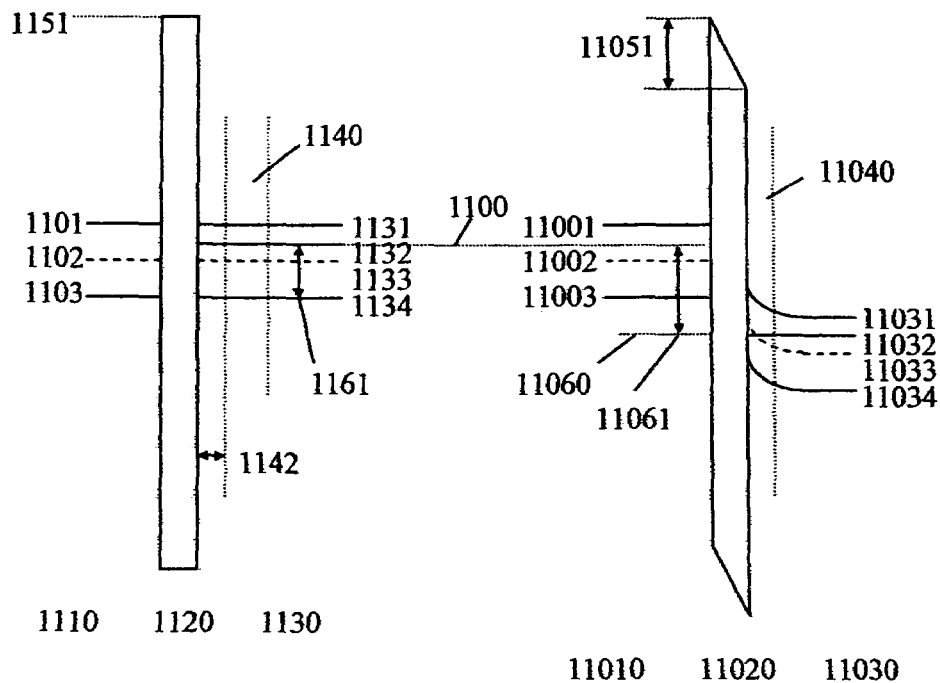
FIGS. 11A and 11B shows a band diagrams for a first on state Gated-PFET device.

At a gate voltage higher than the threshold the bands attain a flat band level as shown in FIG. 11A. This flat band voltage is defined $V_{FB}$ and is shown by voltage level 1161. Fixed oxide charge affect $V_{FB}$. In FIG. 11A the gate is biased to $V_{FB}$ while the channel is held at $V_S$. Hence, Fermi level 1132 in the Silicon is at $V_S$, while the Fermi level of P+ poly 1103 is at $V_{FB}$. The voltage drop across the oxide 1151 is zero, and the band bending in the Silicon is also zero. When there is no fixed oxide charge in the oxide, $V_{FB}$ equals the work-function difference between gate and Silicon. There is no meaning to a depletion region under this bias condition, and the entire Silicon film thickness 1142 has majority carriers at the doping level of the Silicon. This is seen by the flat Fermi level 1132 in FIG. 11A. FIG. 11B shows the gate at $V_{FB}$ and the channel at drain edge biased to $V_D$. Silicon Fermi level 11032 is at $V_D$ volts, while Gate Fermi level 11003 is at $V_{FB}$. Voltage level 11061 shows the applied channel voltage $V_D$ against reference level 1100 at $V_S$. The over voltage between $V_{FB}$ and $V_D$ is now dropped across the oxide and the Silicon creating a depletion region 11040 in Silicon. Such depletion causes a current saturation in the conducting channel. Hence at a bias $V_G=V_{FB}$, the Gated-NFET conducts with a current saturation occurring at a voltage when the channel depth is pinched-off near the drain edge.

Figures 12A, 12B:
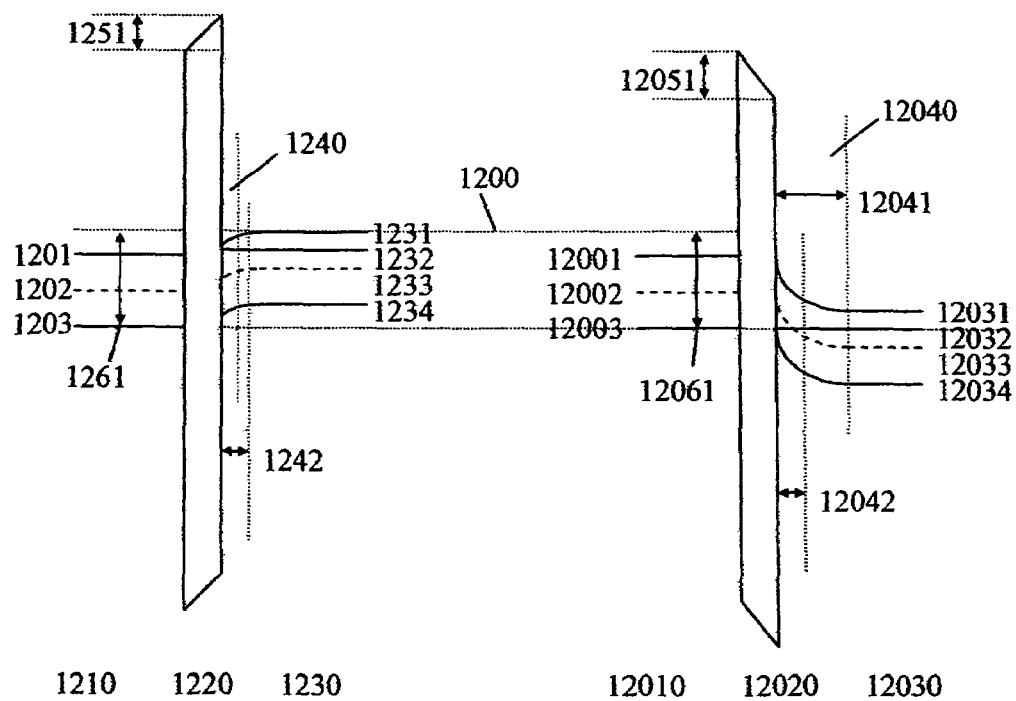
FIGS. 12A and 12B shows a band diagrams for a second on state Gated-PFET device.

A Gated-NFET with a gate biased at power supply $V_D$ is shown in FIGS. 12A and 12B. In FIG. 12A the channel is at source edge with a voltage $V_S$. Gate Fermi level 1203 is at $V_D$, while the channel Fermi level 1232 is at $V_S$. The over voltage between $V_{FB}$ and $V_D$ is now dropped across the oxide and the Silicon creating an accumulation region 1240 near the channel surface. The majority carrier concentration is now far higher than the original doping level of the Silicon layer. This provides enhanced channel conduction beyond the doping level chosen for the film. The channel film thickness 1242 is chosen thicker than the accumulation width to facilitate a strong on current for the Gated-NFET. FIG. 12B shows the gate and channel both at $V_D$. Both Fermi levels 12003 and 12032 are at $V_D$, above reference level 1200 by a value $V_D$. The band diagram is identical to FIG. 10A when both sides were biased at $V_S$. Again the drain edge of the channel is pinched-off demonstrating the existence of current saturation in the device.

The diagrams shown in FIGS. 10, 11 and 12 have consistent labels. All diagrams consistently show the existence of a thin film channel region that will allow construction of a Gated-NJFET device by ensuring an on state and an off state. The channel is fully depleted of majority carriers in the off state. The gate and the semiconductor material properties need to be chosen to ensure this condition. The flat band voltage for the system needs to be large enough to fully deplete the chosen channel thickness when the device is off. In the embodiment chosen a P+ doped poly Silicon gate material, an oxide dielectric and an N− doped Silicon channel meets that condition. A thinner dielectric thickness and a lower dielectric constant material for the gate insulator allow a lower voltage loss across the dielectric and a larger channel modulation in the Silicon.

The lightly doped resistive channel region formed on a first semiconductor thin film geometry 480 forming the conducting paths between source 413 and drain 414 in FIG. 4 can be a thinned down SOI single crystal Silicon film, or a deposited thin Poly-crystalline Silicon film, or a post laser annealed as deposited amorphous Poly-crystalline Silicon film. The thickness and doping of the channel region 406 are optimized with the insulator 405 thickness $T_G$ and gate material work function to get the required threshold voltage Vt, on-current and off-current for these devices. The channel 406 thickness $T_S$ optimization to contain the fully depleted channel as discussed earlier is discussed in detail next Two thickness parameters X and Y for a semiconductor material are defined by:

$$X = \epsilon_S * T_G \epsilon_G \text{ Angstroms} \quad (EQ\ 1)$$

$$Y = [(2*\epsilon_S*V_{FB})/(q*D)]^{0.5} \text{ Angstroms} \quad (EQ\ 2)$$

$$X_D = (X^2 + Y^2)^{0.5} - X \text{ Angstroms} \quad (EQ\ 3)$$

$$T_S < X_D \text{ Angstroms} \quad (EQ\ 4)$$

where, $\epsilon_S$ is channel semiconductor permittivity, $\epsilon_G$ is gate insulator permittivity, $T_G$ is gate insulator thickness, $V_{FB}$ is gate to semiconductor absolute flat band voltage, q is electron charge, D is channel doping level, $X_D$ is the depletion depth and $T_S$ is channel semiconductor layer thickness. EQ-3 denotes the maximum depletion width for the off Gated-FET shown as depth 641 in FIG. 6A and depth 1041 in FIG. 10A. The inequality in EQ-4 ensures film thicknesses 642 and 1042 shown FIGS. 6A and 10A respectively are within the maximum depletion depths 641 and 1041 into Silicon channel. Preferably $T_S$ is chosen to be in the range $0.2*X_D$ to $0.9*X_D$, and more preferably $T_S$ is chosen to be in the range $0.4*X_D$ to $0.8*X_D$ range.

For most practical doping levels and oxide thicknesses, Y is much larger than X value. EQ-3 can be simplified to:

$$X_D = Y - X + X^2/(2*Y) \text{ Angstroms} \quad (EQ\ 5)$$

For Poly-Oxide-Silicon Gated-FET devices, when D is 2E17 Atomc/cm³ doping density (i.e. 2E-7 Atoms/A³, where A=Angstroms), $T_G$=70 A, $\epsilon_S/\epsilon_{OX}$=3, and assuming no fixed charge in the oxide the following is easily shown: the flat band voltage $V_{FB}$=0.987V, X=210 A, and Y=799 A. Using EQ-3, $X_D$=616 A. EQ-5 also yields $X_D$=616 A as Y>X criterion is met. Hence a semiconductor layer preferably 120-550 A, more preferably 250-490 A meets the channel thickness requirement. For the Poly-Oxide-Silicon Gated-FET device, a simplified practical criterion can be extracted from EQ-5 as:

$$X_D \sim \sqrt{D*(0.36/D+12.5*T_{OX}^2)} - 3*T_{OX} \text{ Angstroms} \quad (EQ\ 6)$$

Where, D is in Atoms/A³. This expression assumes a $V_{FB}$=1V. For the example discussed earlier, EQ-6 yields $X_D$~622 A, in fairly good agreement to the correct 616 A.

The insulator thickness and channel doping also needs to satisfy the threshold voltage for the Gated-FET device. This threshold voltage is preferable selected in the range $0.18*V_D$ to $0.4*V_D$, and more preferably $0.2*V_D$ to $0.3*V_D$, where $V_D$ is the power supply voltage. This puts an added constraint on the semiconductor film thickness 642 and 1042 shown in FIG. 6A and FIG. 10A respectively. When a voltage $V_T$ is applied at the gate, the depletion width 641 (or 1041) equals semiconductor thickness 642 (or 1042) for the Gated-FET device. At that bias, EQ-2 is modified by the additional bias, to a new thickness defined by:

$$Z = [(2*\epsilon_S*(V_{FB}-V_T))/(q*D)]^{0.5} \text{ Angstroms} \quad (EQ\ 7)$$

$$T_S = (X^2 + Z^2)^{0.5} - X \text{ Angstroms} \quad (EQ\ 8)$$

EQ-8 shows the relationship between doping level D and semiconductor film thickness $T_S$ required to satisfy the Gated-FET design. EQ-8 satisfies the constraint for maximum semiconductor film thickness in EQ-4 trivially. For the example discussed earlier, for a 1.5V process with $V_T$ at 0.42V, EQ-7 yields Z=606 A, and from EQ-8 $T_S$=431 A well within the desired thickness range 300-500 A. The gate dielectric thickness and dielectric fixed charge density impacts this threshold voltage.

Other embodiments may use gate and substrate materials different from Silicon. Gate dielectrics can be oxide, oxy-nitride, nitride, or multi-layered insulators. The semiconductor material may be Silicon, Silicon-germanium, gallium-arsenide, germanium, or any other III-V material. The gate material may be poly-Silicon, aluminum, tungsten, or any other metal. The value of X in equation-1 will change based on the physical properties of the materials chosen to form the Gated-FET device.

The total resistance of the conducting body region for Gated-FET under conducting mode is determined by the applied voltage difference between drain and source nodes, and gate over voltage above threshold. A typical device top view and cross section is shown in FIG. 13. In addition, the device channel width 1391 ($W_S$), device channel length 1392 ($L_S$) and film thickness 1393 ($T_S$) all determine the device on current. The channel resistance is given by:

$$R = \rho_S * L_S / (W_S * T_S) \text{ Ohms} \quad (EQ\ 9)$$

where, $\rho_S$ is the resistivity of as doped channel region 1340. Gate voltage and channel depletion heavily modulates resistivity $\rho_S$. Parameters are chosen for R to be preferably in the 1 KOhm to 1 Meg-Ohm range, more preferably 10 KOhm to 100 KOhms, when the channel is on. As an example, for P− doping 2E17 atoms/cm³, under flat-band conditions in FIG. 7A, the resistivity for single crystal Silicon is 0.12 Ohm-cm. When $L_S$=0.3μ, $W_S$=0.3μ, $T_S$=431 Angstroms, R is 27.8 KOhms. When $V_{DS}$=0.2V (drain to source bias), the channel current $I_{ON}$ is 7 μA. This is the conduction level under flat band bias condition in FIG. 7A for the Gated-PFET. Poly-Silicon mobility is lower than single crystal Silicon degrading the on current for non single-crystal films. The surface accumulations shown in FIG. 8A and FIG. 12A for Gated-PFET and Gated-NFET devices enhance the channel $I_{ON}$ current for higher gate biases. An effective film thickness increase is used to express the channel resistance as defined by:

$$R = \rho_{S0} * L_S / [W_S * ((1+\gamma) T_S)] \text{ Ohms} \quad (EQ\ 10)$$

Where $\gamma$ absorbs the channel modulation effects, and $\rho_{S0}$ remains the resistivity at doping level D of the thin film channel region. The $\gamma$ value depends on the depth of the accumulation region into thin film channel, and the surface potential at the Semiconductor-Insulator interface in the band diagrams in FIG. 8A and FIG. 12-A If the absolute surface potential is $\Phi_S$ in the semiconductor, a system of equations can be solved by trial and error to converge on the correct $\Phi_S$ value.

$$N_S = D * \exp(q \Phi_S / kT) \quad (EQ\ 11)$$

$$L_D = [\in_S * kT / (q^2 N_S)]^{0.5} \quad (EQ\ 12)$$

$$X_A = \sqrt{2} * L_D * [(N_S/D)^{0.5} - 1] \quad (EQ\ 13)$$

$$Q_S = q * N_S * X_A / (1 + X_A / (\sqrt{2} * L_D)) \quad (EQ\ 14)$$

$$\Phi_S = V_D - V_{FB} - T_G * Q_S / \in_G \quad (EQ\ 15)$$

Referring to FIG. 8A (or equivalently FIG. 12A), EQ-11 denotes the excess surface concentration of majority carriers due to the surface potential $\Phi_S$ at the surface. EQ-12 denotes the Debye length at the surface concentration $N_S$. EQ-13 denotes the depth of accumulation layer penetration into semiconductor region. At this depth, the doping level drops off to the channel doping level D, and no accumulation is further observed. EQ-14 denotes the total excess accumulation charge in the semiconductor thin film due to accumulation. EQ-15 is the voltage balance where the over voltage above flat-band is distributed across gate insulator and semiconductor film. A consistent solution to the system of equations 11-15 can be achieved iteratively. To achieve the full benefit from the enhanced conduction due to accumulation, the film thickness is further chosen such that:

$$T_S > X_A \quad (EQ\ 16)$$

Preferably $T_S$ is chosen in the range $1*X_A$ to $10*X_A$, and more preferably $T_S$ is chosen in the range $2*X_A$ to $6*X_A$. When EQ-16 is met, the effective thickness increase factor $\gamma$ due to accumulation can be expressed as:

$$\gamma = \sqrt{2} * (L_D/T_S) * [(N_S/D) - (N_S/D)^{0.5}] \quad (EQ\ 17)$$

This shows that the accumulation effectively acts so as to increase the thin film thickness beyond the chosen $T_S$ value at the same doping density D. This enhancement can be quite significant. For the example chosen earlier, for 1.5V power supply, the over voltage $(V_D - V_{FB}) = 0.513V$. Start with a guess surface voltage $\Phi_S = 0.0927V$. Substituting in EQ-11 through EQ-15: $N_S = 7.21E18$ Atoms/cm$^3$, $L_D = 15.2$ A, $X_A = 108$ A, $Q_S = 2.07E-7$ C. Substituting into EQ-15 the surface voltage is recalculated as $\Phi_S = 0.0926V$ same as the starting point. Thickness enhancement factor is calculated from EQ-17 as $\gamma = 1.50$. This $\gamma$ is very sensitive to $V_D$ over voltage above. $V_{FB}$. For a 1.8V power supply, $\gamma = 2.47$. When $L_S = 0.3\mu$, $W_S = 0.3\mu$, $T_S = 431$ Angstroms, new R under accumulated surface condition is 11.1 KOhms. When $V_{DS} = 0.2V$ (drain to source bias), the channel current $I_{ON}$ is 18 μA, a significant increase over the flat-band gate voltage bias condition. For this example, the condition in EQ-17 is met as the film thickness 431A is larger than the accumulation depth 108A. Under flat-band condition, or when $V_D < V_{FB}$, there is no surface accumulation and EQ-16 simply reduces to $T_S > 0$ A.

Figure 13A:
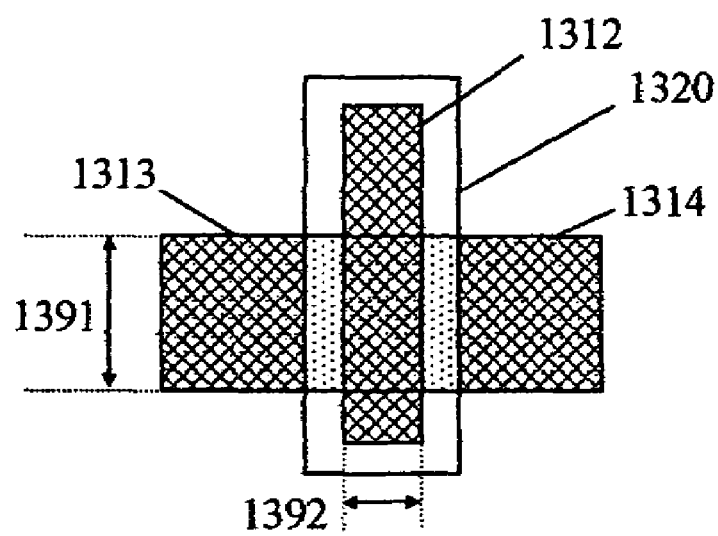
FIGS. 13A and 13B shows a top view and cross sectional view of a fabricated Gated-FET device.
Figure 13B:
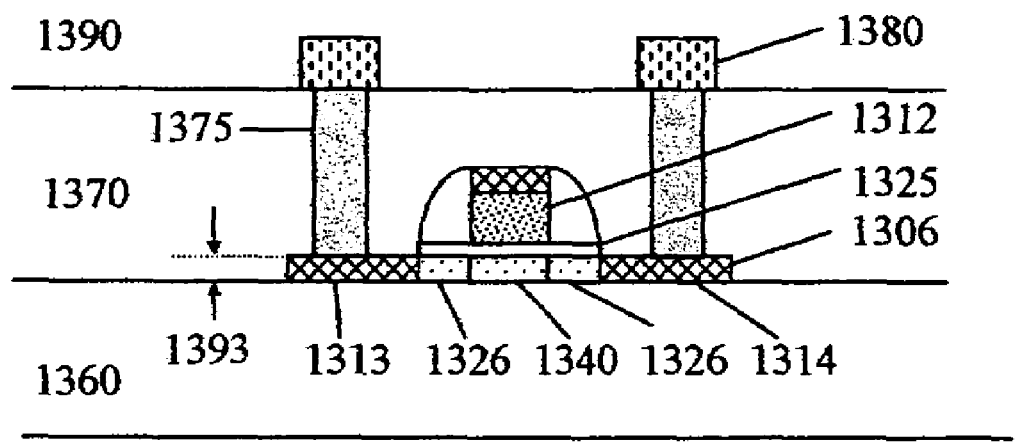

The following terms used herein are acronyms associated with certain manufacturing processes. The acronyms and their abbreviations are as follows:

$V_T$ Threshold voltage
$V_{TN}$ Gated-NFET Threshold voltage
$V_{TP}$ Gated-PFET Threshold voltage
LDN Lightly doped Gated-NFET drain
LDP Lightly doped Gated-PFET drain
LDD Lightly doped drain
RTA Rapid thermal annealing
Ni Nickel
Ti Titanium
Co Cobalt
Si Silicon
TiN Titanium-Nitride
W Tungsten
S Source
D Drain
G Gate
ILD Inter layer dielectric
C1 Contact-1
M1 Metal-1
P1 Poly-1
P− Positive light dopant (Boron species, $BF_2$)
N− Negative light dopant (Phosphorous, Arsenic)
P+ Positive high dopant (Boron species, $BF_2$)
N+ Negative high dopant (Phosphorous, Arsenic)
Gox Gate oxide
C2 Contact-2
CVD Chemical vapor deposition
LPCVD Low pressure chemical vapor deposition
PECVD Plasma enhanced CVD
ONO Oxide-nitride-oxide
LTO Low temperature oxide The device shown in FIG. 13, and discussed in the example earlier has P+ doped poly-Silicon gate over N− doped channel for the Gated-NFET, and N+ doped poly-Silicon gate over P− doped channel for the Gated-PFET. This is easily achieved in the fully salicided source/drain embodiment shown in FIG. 13. The Gated-NFET and Gated-PFET gate regions 1312 are first doped P+ and N+ respectively before the gates are etched. After gates are etched, prior to spacer 1320 formation, Gated-NFETs are implanted with N type LDN tip implant and Gated-PFETs are implanted with P type LDP tip implant. The LDD tip-implant dose is much lower than the gate doping to affect gate doping type. The Source & Drain regions are now defined by the self aligned LDD tip implants regions 1326 shown under the spacer oxides 1320 adjacent to the gate 1312 regions in FIG. 13B. As the drain 1314 and source 1313 regions outside the spacer are fully consumed by salicide, those regions do not need heavy doping. The channel 1306 doping levels N− for Gated-NFET and P− for Gated-PFET are chosen to achieve the desirable $V_T$ as discussed earlier. The first semiconductor thin film layer 1306 forming the source 1313, LDD tips 1326, channel 1306 and drain 1314 can be thinned down SOI single crystal Silicon material, or a first thin-film PolySilicon layer, or a laser crystallized amorphous Silicon layer, or any other thin film semiconductor layer. A thicker first film allows higher current.

The gate dielectric 1305 is grown either thermally or deposited by PECVD. The first thin film layer 1306 (P1) forms the body of the transistor. The P1 layer is deposited above the insulator layer 1307. The insulator is oxide, or nitride, or a reversed bias doped semiconductor region (in the case when source and drain regions are not fully salicided) that can isolate P1 geometry 1380. A P1 mask is used to define and etch these P1 islands. Gated-PFET regions are mask selected and implanted with P– doping, and gated N-FET devices are implanted with N– doping, the channel doping $V_T$ levels required for Gated-FET devices. The gate 1312 is deposited after the gate insulator 1305 is deposited as a second thin film semiconductor layer (P2). In the embodiment shown, the second thin film layer is a PolySilicon layer. The Gated-PFET gate poly 1312 is mask selected and implanted N+ and Gated-NFET is implanted with P+ prior to gate definition and etch. The gate regions are then defined and etched. A P tip (LDP) implant is used over all Gated-PFET devices, and an N tip (LDN) implant is used for Gated-NFET devices. This can be done by open selecting Gated-PFET devices, and not selecting Gated-NFET devices and visa-versa. The N+ and P+ doped gates are not affected by the lower N and P tip implant level. Gate 1312 blocks P and N tip implants getting into channel region 1340, and only P1 regions outside P2 gets this tip implant. Spacer oxide regions 1320 are formed on either side of gate by conventional oxide deposition and etch back techniques. In FIG. 13A, the P2 gate 1312 is perpendicular to P1 geometry 1380. The P2 gate 1312 and spacers 1320 sub-divide the P1 geometry into five regions: (1) source region 1313, (2) source spacer region 1326 doped with LDD tip implant, (3) channel region 1306 doped with $V_T$ implant, (4) drain spacer region 1326 also doped with LDD tip implant and (5) drain region 1314. The source and drain regions are fully salicided and need no implant. After the spacer etch, exposed P2 and P1 regions are reacted with deposited Nickel (or Cobalt) and salicided using Rapid Thermal Annealing. The LDD tip implant after P2 etch forms self-aligned Source/Drain LDD tip regions and salicidation after spacer etch forms self aligned Source/Drain salicide regions adjacent to spacer regions. After excess Ni etch, a dielectric film 1370 is deposited and C2 1375 is defined and etched. These are W-filled and polished. A M1 1380 is deposited, defined and etched, and a dielectric 1390 deposited to add multiple layers of metal in the process.

For the device in FIG. 13 a high quality P1 film is beneficial. The terms P1 refers to the first semiconductor layer in FIG. 13 and P2 refers to the second semiconductor layer in FIG. 13 forming the gate. An ideal film is a single crystal Silicon with a precise thickness control over an insulator. In SOI technology, the single crystal Silicon layer above an insulator meets this criterion. Inside a Gated-FET array, P1 is mask selected and thinned down to the required thickness as defined by EQ-8. This allows formation of two sets of transistors adjacent to each other: regular SOI MOSFET and thinned down SOI Gated-FET.

In one embodiment, a logic process is used to fabricate CMOS devices on a substrate layer. These CMOS devices may be used to build AND gates, OR gates, inverters, adders, multipliers, memory and other logic functions in an integrated circuit. A Complementary Gated-FET TFT module layer is inserted to a logic process at a first contact mask to build a second set of TFT Gated-FET devices. An exemplary logic process may include one or more following steps:

P-type substrate starting wafer
Shallow Trench isolation: Trench Etch, Trench Fill and CMP
Sacrificial oxide
PMOS $V_T$ mask & implant
NMOS $V_T$ mask & implant
Pwell implant mask and implant through field
Nwell implant mask and implant through field
Dopant activation and anneal
Sacrificial oxide etch
Gate oxidation/Dual gate oxide option
Gate poly (GP) deposition
GP mask & etch
LDN mask & implant
LDP mask & implant
Spacer oxide deposition & spacer etch
N+ mask and NMOS N+ G, S, D implant
P+ mask and PMOS P+ G, S, D implant
Ni deposition
RTA anneal—Ni salicidation (S/D/G regions & interconnect)
Unreacted Ni etch
ILD oxide deposition & CMP FIG. 14 shows an exemplary process for fabricating a thin film Gated-FET device in a module layer. In one embodiment the process in FIG. 14 forms a Gated-FET device in a layer substantially above the substrate layer. The processing sequence in FIG. 14.1 through 14.8 describes the physical construction of a Gated-FET device shown in FIG. 13. The process shown in FIG. 14 includes adding one or more following steps to the logic process after ILD oxide CMP step.

C1 mask & etch
W-Silicide plug fill & CMP
~400 A poly P1 (crystalline poly-1) deposition
P1 mask & etch
Blanket $V_{TN}$ N– implant (Gated-NFET $V_T$)
$V_{TP}$ mask & P– implant (Gated-PFET $V_T$)
TFT Gox (70 A PECVD) deposition
600 A P2 (crystalline poly-2) deposition
Blanket P+ implant (Gated-NFET gate & interconnect)
N+ mask & implant (Gated-PFET gate & interconnect)
P2 mask & etch
Blanket LDN Gated-NFET N tip implant
LDP mask and Gated-PFET P tip implant
Spacer LTO deposition
Spacer LTO etch to form spacers & expose P1
Ni deposition
RTA salicidation and poly re-crystallization (exposed P1 and P2)
Fully salicidation of exposed P1 S/D regions
Dopant activation anneal
Excess Ni etch
ILD oxide deposition & CMP
C2 mask & etch
W plug formation & CMP
M1 deposition and back end metallization The TFT process technology consists of creating Gated-PFET and Gated-NFET poly-Silicon transistors. In the embodiment in FIG. 14, the module insertion is after the substrate device gate poly etch and the ILD film deposition. In other embodiments the insertion point may be after M1 and the subsequent ILD deposition, prior to V1 mask, or between two other metal definition steps.

In the logic process, after gate poly of regular transistors are patterned and etched, the poly is salicided using Cobalt or Nickel & RTA sequences. Then an ILD is deposited, and polished by CMP techniques to a desired thickness. In the shown embodiment, the contact mask is split into two levels. The first C1 mask contains all contacts that connect Gated-FET outputs to substrate transistor gates or diffusion nodes. Then the C1 mask is used to open and etch contacts in the ILD film. Ti/TiN glue layer followed by W-Six plugs, W plugs or Si plugs may be used to fill the plugs, then CMP polished to leave the fill material only in the contact holes. The choice of fill material is based on the thermal requirements of the TFT module in subsequent steps. Si plugs allow RTA thermal oxidation of P1 at a subsequent step.

Then, a first P1 poly layer, amorphous or crystalline, is deposited by LPCVD to a desired thickness as shown in FIG. 14.1. The P1 thickness is between 50 A and 1000 A, and preferably between 200-600 A. This poly layer P1 is used for the channel, source, and drain regions for both Gated-FETs. P1 is patterned and etched to form the transistor geometries. In other embodiments, P1 is used as contact pedestals to stack a C2 contact above C1. Gated-NFET transistors are blanket implanted with N− doping, while the Gated-PFET transistor regions are mask selected and implanted with P− doping. This is shown in FIG. 14.2. The implant doses and P1 thickness are optimized to get the required threshold voltages for Gated-PFET & Gated-NFET devices under fully depleted transistor operation, and maximize on/off device current ratio. The pedestals implant type is irrelevant at this point. In another embodiment, the $V_T$ implantation is done with a mask P− implant followed by masked N− implant. First doping can also be done in-situ during poly deposition or by blanket implant after poly is deposited.

Patterned and implanted P1 may be subjected to dopant activation and crystallization. In one embodiment, RTA cycle is used to activate & crystallize the poly after it is patterned to near single crystal form. In a second embodiment, the gate dielectric is deposited, and buried contact mask is used to etch areas where P1 contacts P2 layer. Then, Ni is deposited and salicided with RTA cycle. All of the P1 in contact with Ni is salicided, while the rest poly is crystallized to near single crystal form. Then the unreacted Ni is etched away. In a third embodiment, amorphous poly is crystallized prior to P1 patterning with an oxide cap, metal seed mask, Ni deposition and MILC (Metal-Induced-Lateral-Crystallization).

Then the TFT gate dielectric layer is deposited followed by P2 layer deposition. The dielectric is deposited by PECVD techniques to a desired thickness in the 30-200 A range, desirably 30-100 A thick. The gate may be grown thermally by using RTA when C1 plug fill is doped Silicon. This gate material could be an oxide, nitride, oxynitride, ONO structure, or any other dielectric material combination used as gate dielectric. The dielectric thickness is determined by the voltage level of the process. At this point an optional buried contact mask BC may be used to open selected P1 contact regions, etch the dielectric and expose P1 layer. BC could be used on P1 pedestals to form P1/P2 stacks over C1. In the P1 salicided embodiment using Ni, the dielectric deposition and buried contact etch occur before the crystallization. In the preferred embodiment, no BC is used.

Then second poly P2 layer, 200 A to 1000 A thick, preferably 300-800 A is deposited as amorphous or crystalline poly-Silicon by LPCVD as shown in FIG. 14.3. Then Gated-NFET devices & P+ poly interconnects are blanket implanted with P+ implant. The implant energy ensures full dopant penetration into the P2 layer. This doping gets to only P2 regions as no P1 regions are exposed. An N+ mask is used to select Gated-PFET devices and N+ interconnect, and implanted with N+ dopant as shown in FIG. 14.4. Transistor gate regions of Gated-PFET and Gated-NFET are doped to the correct dopant type. Source and drain regions are blocked by P1 and not implanted. This N+/P+ implants can be done with N+ mask followed by P+ mask. The $V_T$ implanted P1 regions are completely covered by P2 layer and form channel regions of Gated-NFET & Gated-PFET transistors.

P2 layer is defined into Gated-NFET & Gated-PFET gate regions intersecting the P1 layer channel regions, C1 pedestals if needed, and local interconnect lines and then etched as shown in FIG. 14.5. The P2 layer etching is continued until the dielectric oxide is exposed over P1 areas uncovered by P2 (source, drain, P1 resistors). As shown in FIG. 13A, the source & drain P1 regions orthogonal to P2 gate regions are now self aligned to P2 gate edges. The S/D P2 regions may contact P1 via buried contacts. Gated-NFET devices are blanket implanted with LDN N dopant. Then Gated-PFET devices are mask selected and implanted with LDP P dopant as shown in FIG. 14.5. The implant energy ensures full dopant penetration through the residual oxide into the S/D regions adjacent to P2 layers. The N and P type dopant level is much lower than the N+ and P+ dopant levels used to dope P2 regions. Hence P2 is unaffected by these LDD implants.

A spacer oxide is deposited over the LDD implanted P2 using LTO or PECVD techniques as shown in FIG. 14.6. The oxide is etched to form spacers 1320 shown in FIG. 13. The spacer etch leaves a residual oxide over P1 in a first embodiment, and completely removes oxide over exposed P1 in a second embodiment. The latter allows for P1 salicidation at a subsequent step. After the spacer etch Nickel is deposited over P2 and salicided to form a low resistive refractory metal on exposed poly by RTA. Unreacted Ni is etched as shown in FIG. 14.7. This 100 A-500 A thick Ni-salicide connects the opposite doped poly-2 and poly-1 regions together providing low resistive poly wires for data transfer. In one embodiment, the residual gate dielectric left after the spacer prevents P1 layer salicidation. In a second embodiment, as the residual oxide is removed over exposed P1 after spacer etch, P1 is salicided. The thickness of Ni deposition may be used to control full or partial salicidation of P1 regions in FIG. 13. Fully salicided S/D regions up to spacer edge facilitate high drive current due to lower source and drain resistances.

An LTO film is deposited over P2 layer, and polished flat with CMP. A second contact mask C2 is used to open contacts into the TFT P2 and P1 regions in addition to all other contacts to substrate transistors. In the shown embodiment, C1 contacts connecting Gated-FET outputs to substrate transistors require no C2 contacts. Contact plugs are covered with a glue layer, filled with tungsten, CMP polished, and connected by metal as done in standard contact metallization of IC's as shown in FIG. 14.8.

In another embodiment, thinned down SOI is used to construct the Gated-FET shown in FIG. 13. The SOI starting wafer is chosen to have the correct P1 thickness as given by EQ-8. This can be achieved by thinning down an existing SOI wafer to Silicon thickness ~400 A as discussed in the example. The process sequence is similar to the Gated-FET TFT device fabrication, except for the starting point. There is no preceding logic process, and the P1 definition is the starting point for the Gated device fabrication as detailed in the TFT process sequence. In another embodiment, an SOI logic process is used to fabricate CMOS devices on a substrate layer, and a second thinned down Gated-FET device for special applications. Standard SOI devices may be used to build AND gates, OR gates, inverters, adders, multipliers, memory and other logic functions in an integrated circuit Thinned down SOI Gated-FET devices may be constructed to integrate a high density of latches or memory into the first fabrication module. A thinned down SOI module is inserted to an exemplary SOI logic process which includes one or more of following steps:

SOI substrate wafer
Shallow Trench isolation: Trench Etch, Trench Fill and CMP
Sacrificial oxide
Periphery PMOS $V_T$ mask & implant
Periphery NMOS $V_T$ mask & implant
Gated-FET mask and Silicon etch
Gated-FET blanket $V_T$ N implant
Gated-FET $V_T$ P mask and P implant
Dopant activation and anneal
Sacrificial oxide etch
Gate oxidation/Dual gate oxide option
Gate poly (GP) deposition
Gated-FET N+ mask and N+ implant
Gated-FET P+ mask and P+ implant
GP mask & etch
LDN mask & N– implant
LDP mask & P– implant
Spacer oxide deposition & spacer etch
Periphery N+ mask and N+ implant
Periphery P+ mask and P+ implant
Ni deposition
RTA anneal—Ni salicidation (S/D/G regions & interconnect)
Dopant activation
Unreacted Ni etch
ILD oxide deposition & CMP
C mask and etch In this embodiment, the Gated-FET body doping is independently optimized for performance, but shares the same LDN, LDP implants. The Gated-FET gates are separately doped N+ & P+ prior to gate etch and blocked during N+/P+ implants of peripheral SOI devices as the dopant types differ. In other embodiments, Gated-FET devices and periphery MOSFET devices may share one or more $V_T$ implants. One P2 is used for latch and peripheral device gates. In another embodiment, SOI substrate devices may be integrated with a TFT latch module. This allows for a SOI inverter and TFT inverter to be vertically integrated to build high density, fast access memory devices.

Processes described in the incorporated-by-reference Provisional Application Ser. Nos. 60/393,763 and 60/397,070 support poly-film TFT-SRAM cell and anti-fuse construction. This new usage differs from the process of FIG. 15 in doping levels and film thicknesses optimized for Gated-FET applications. The thin-film transistor construction and the Thin-Film Anti-Fuse construction may exist side by side with this Thin-Film Gated-FET device if the design parameters overlap.

These processes can be used to fabricate a generic field programmable gate array (FPGA) with the inverters connecting to form latches and SRAM memory. Such memory in a TFT module may be replaced with hard wired connections to form an application specific integrated circuit (ASIC). Multiple ASICs can be fabricated with different variations of conductive patterns from the same FPGA. The memory circuit and the conductive pattern contain one or more substantially matching circuit characteristics. The process can be used to fabricate a high density generic static random access memory (SRAM) with inverters connecting to form latches and SRAM memory. A TFT module may be used to build a vertically integrated SRAM cell with one inverter on a substrate layer, and a second inverter in a TFT layer.

Although an illustrative embodiment of the present invention, and various modifications thereof, have been described in detail herein with reference to, the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A semiconductor thin film Gated-FET device, comprising:
   a semiconductor thin film layer positioned on a first insulator, said first insulator adequately thick to minimize or eliminate any influence of voltages from below; and
   a channel region formed in a fairly uniformly doped portion of said semiconductor thin film layer, the thickness of the channel comprising the entire thin film thickness; and
   a gate terminal coupled to a single gate region formed above said channel region, said gate region formed on a gate material deposited over a gate insulator layer, said gate insulator layer further deposited over the semiconductor thin film layer; wherein:
     a first voltage level at the gate fully depletes all of the majority carriers from the entire thin film layer in said channel region to create a non-conductive channel; and
     a second voltage level at the gate accumulates the majority carriers near the gate surface of the thin film layer in said channel region to create a conductive channel.

2. The device in claim-1 further comprised of:
   a source region and a drain region formed in fairly heavily doped portions of the semiconductor thin film layer, wherein said channel region is formed in between the source and drain regions; and
   a source terminal is coupled to said source region, a drain terminal is coupled to said drain region, and said source and drain regions have a higher level of the same dopant type as said channel region.

3. The device of claim-1, wherein the channel comprises one of a single crystal, polycrystalline Silicon, a re-crystallized Silicon, and any other semiconductor material.

4. The device of claim-1, wherein the gate comprises one of a conductor, a refractory metal, a heavily doped poly-Silicon and a doped semiconductor material.

5. The device of claim-1, wherein the first insulator comprises one of an oxide, an oxy-nitride, a nitride and a dielectric material.

6. The device of claim-1, wherein the gate insulator comprises one of an oxide, an oxy-nitride, a nitride and a dielectric material.

7. The device in claim-2 further comprised of an off state with said gate terminal below a threshold voltage level;
   wherein said thin film channel substantially not conducting a current between said drain and source regions for a differential bias voltage ranging from zero to a system power supply voltage.

8. The device in claim-2 further comprised of an on state with said gate terminal above a threshold voltage level;
   wherein said thin film channel conducting a current between said drain and source regions for a differential bias voltage ranging from zero to a system power supply voltage.

9. The device in claim-2 further comprised of an on state with said gate terminal above a flat band voltage level;
wherein said thin film channel substantially conducting a current between said drain and source regions for a differential bias voltage ranging from zero to a system power supply voltage, and said conducting current enhanced by an accumulation of majority carriers above said channel doping level near the gate insulator surface.

10. The device in claim-2 further comprised of a Gated-NFET device comprising said source, channel and drain regions doped with an N type dopant;
wherein said gate material having a positive flat band voltage, and said source region connected to a lower voltage compared to said drain region.

11. The device in claim-10 further comprises of:
an off state defined by said gate to said source voltage difference in a range from a system ground voltage $V_S$ to a first threshold voltage $V_{TN}$; and
an on state defined by said gate to said source voltage difference in a range from said first threshold voltage $V_{TN}$ to a system power supply voltage $V_D$.

12. The device in claim-10 further comprising a P+ doped poly-Silicon gate material;
wherein said source and drain regions defined by lightly doped N type tip regions adjacent to said channel region self aligned to said gate edge, and said source and drain regions outside of said lightly doped tip regions fully salicided and self aligned to said tip regions.

13. The device in claim-2 further comprised of a Gated-PFET device comprising said source, channel and drain regions doped with a P type dopant;
wherein said gate material having a negative flat band voltage, and said source region connected to a higher voltage compared to said drain region.

14. The device in claim-13 further comprises of:
an off state defined by said gate to said source voltage difference in a range from a system ground voltage $V_S$ to a first threshold voltage $V_{TP}$; and
an on state defined by said gate to said source voltage difference in a range from said first threshold, voltage $V_{TP}$ to a system power supply voltage $V_D$.

15. The device in claim-13 further comprising an N+ doped poly-Silicon gate material;
wherein said source and drain regions defined by lightly doped P type tip regions adjacent to said channel region self aligned to said gate edge, and said source and drain regions outside of said lightly doped tip regions fully salicided and self aligned to said tip regions.

16. A three terminal semiconductor thin film Gated-FET device, comprising:
a semiconductor thin film layer positioned on an insulator, said insulator adequately thick to minimize or eliminate any influence of electrodes from below the insulator; and a source terminal coupled to a source region and a drain terminal coupled to a drain region, said source and drain regions heavily doped with a first dopant type, a uniformly doped channel region positioned in between said source and drain regions comprising a lower doping level of the first dopant type, said source, drain and channel regions formed in the thin film layer, said channel thickness comprising the entire thin film thickness; and
a gate terminal coupled to a gate region, said gate region formed above the channel region on a gate material deposited over a gate insulator layer deposited on the thin film layer, wherein:
a first voltage level at the gate terminal fully depletes all of the majority carriers from the entire thin film layer in said channel region to create a non-conductive channel; and
a second voltage level at the gate terminal accumulates majority carriers near the gate surface of the thin film layer in said channel region to create a conductive channel.

17. The device of claim-16, wherein said non-conductive channel resistance is in a range approximately 10 KOhm to 1 TOhm, and preferably in the range 100 KOhm to 1 TOhm, and more preferably in the range 1 MOhm to 1 TOhms.

18. The device of claim 16, wherein the ratio of said device conductive channel current to said device non-conductive channel current is in a range approximately 100 to 10,000,000,000, and preferably in a range 1000 to 10,000,000,000, and more preferably in a range 10,000 to 10,000,000,000.

19. The device as in claim 16, wherein the semiconductor thin film layer thickness is in the range 30 to 600 Angstroms, and preferably in the range 100 to 400 Angstroms and more preferably in the range 200 to 350 Angstroms.

20. A semiconductor thin film Gated-FET device, comprising:
a lightly doped resistive channel region formed on a semiconductor thin film layer, the thickness of the channel comprising the entire thin film thickness; and
an insulator layer deposited on said channel surface with a gate region formed on a gate material deposited on said insulator layer, said gate region receiving a gate voltage comprised of:
a first level that modulate said channel resistance to a substantially non-conductive state by fully depleting majority carriers from said thin film layer in the channel region; and
a second level that modulate said channel resistance to a substantially conductive state by at least partially accumulating majority carriers near the gate surface of the thin film layer in said channel region.

* * * * *